United States Patent
Ahn

(10) Patent No.: US 8,045,072 B2
(45) Date of Patent: Oct. 25, 2011

(54) LIQUID CRYSTAL DISPLAY DEVICE

(75) Inventor: Byung Chul Ahn, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 311 days.

(21) Appl. No.: 12/068,361

(22) Filed: Feb. 5, 2008

(65) Prior Publication Data

US 2008/0143903 A1     Jun. 19, 2008

Related U.S. Application Data

(62) Division of application No. 11/137,426, filed on May 26, 2005, now Pat. No. 7,351,623.

(30) Foreign Application Priority Data

May 27, 2004    (KR) ........................ 10-2004-0037770

(51) Int. Cl.
    *G02F 1/1333*     (2006.01)
(52) U.S. Cl. .............................. 349/38; 349/39; 349/192
(58) Field of Classification Search .............. 349/38–39, 349/192
See application file for complete search history.

(56) References Cited

U.S. PATENT DOCUMENTS

| | | | |
|---|---|---|---|
| 5,162,933 A | 11/1992 | Kakuda et al. | |
| 5,317,433 A | 5/1994 | Miyawaki et al. | |
| 5,339,181 A | 8/1994 | Kim et al. | |
| 5,462,887 A | 10/1995 | Glück | |
| 5,668,379 A | 9/1997 | Ono et al. | |
| 5,731,856 A | 3/1998 | Kim et al. | |
| 5,771,083 A | 6/1998 | Fujihara et al. | |
| 5,793,460 A | 8/1998 | Yang | |
| 5,847,781 A | 12/1998 | Ono et al. | |
| 5,880,794 A | 3/1999 | Hwang | |
| 7,211,898 B2 * | 5/2007 | Lee et al. | 257/759 |
| 7,256,842 B2 | 8/2007 | Hwang et al. | |
| 7,414,697 B1 * | 8/2008 | Choi et al. | 349/192 |
| 7,554,630 B2 * | 6/2009 | Kwon et al. | 349/111 |
| 2002/0001048 A1 | 1/2002 | Lee et al. | 349/43 |
| 2002/0153566 A1 | 10/2002 | Hwang | 257/347 |
| 2002/0180897 A1 | 12/2002 | Chae | 349/39 |
| 2003/0007108 A1 | 1/2003 | Hwang et al. | |
| 2003/0076452 A1 * | 4/2003 | Kim et al. | 349/43 |
| 2004/0048407 A1 | 3/2004 | Lee | 438/30 |
| 2004/0232443 A1 * | 11/2004 | Cho et al. | 257/202 |

FOREIGN PATENT DOCUMENTS

| | | |
|---|---|---|
| CN | 1388405 A | 1/2003 |
| JP | 2081028 | 3/1990 |

(Continued)

*Primary Examiner* — Phu Vu
(74) *Attorney, Agent, or Firm* — McKenna Long & Aldridge LLP

(57) ABSTRACT

A thin film transistor substrate of a LCD device and a fabricating method thereof are disclosed for simplifying a fabricating process and enlarging a capacitance value of a storage capacitor without any reduction of aperture ratio. The LCD device includes: a double-layered gate line having a first transparent conductive layer and a second opaque conductive layer, the second opaque conductive layer have a step coverage; a gate insulation layer film on the gate line; a data line crossing the gate line to define a pixel region; a TFT connected to the gate line and the data line; a pixel electrode connected to the TFT via a contact hole of a protective film on the TFT; and a storage capacitor overlapping the pixel electrode and having a lower storage electrode formed of the first transparent conductive layer.

15 Claims, 36 Drawing Sheets

FOREIGN PATENT DOCUMENTS

| | | |
|---|---|---|
| JP | 5-019291 | 1/1993 |
| JP | 5323375 | 12/1993 |
| JP | 6-208131 | 7/1994 |
| JP | 9074203 | 3/1997 |
| JP | 9-243989 | 9/1997 |
| JP | 10-319438 | 12/1998 |
| JP | 11160732 | 6/1999 |
| JP | 2001-339072 | 12/2001 |
| JP | 2002-141512 | 5/2002 |
| JP | 2002-303877 | 10/2002 |
| JP | 2003114450 | 4/2003 |
| JP | 2003-309269 | 10/2003 |
| JP | 2003-347314 | 12/2003 |
| JP | 2004-046144 | 2/2004 |

* cited by examiner

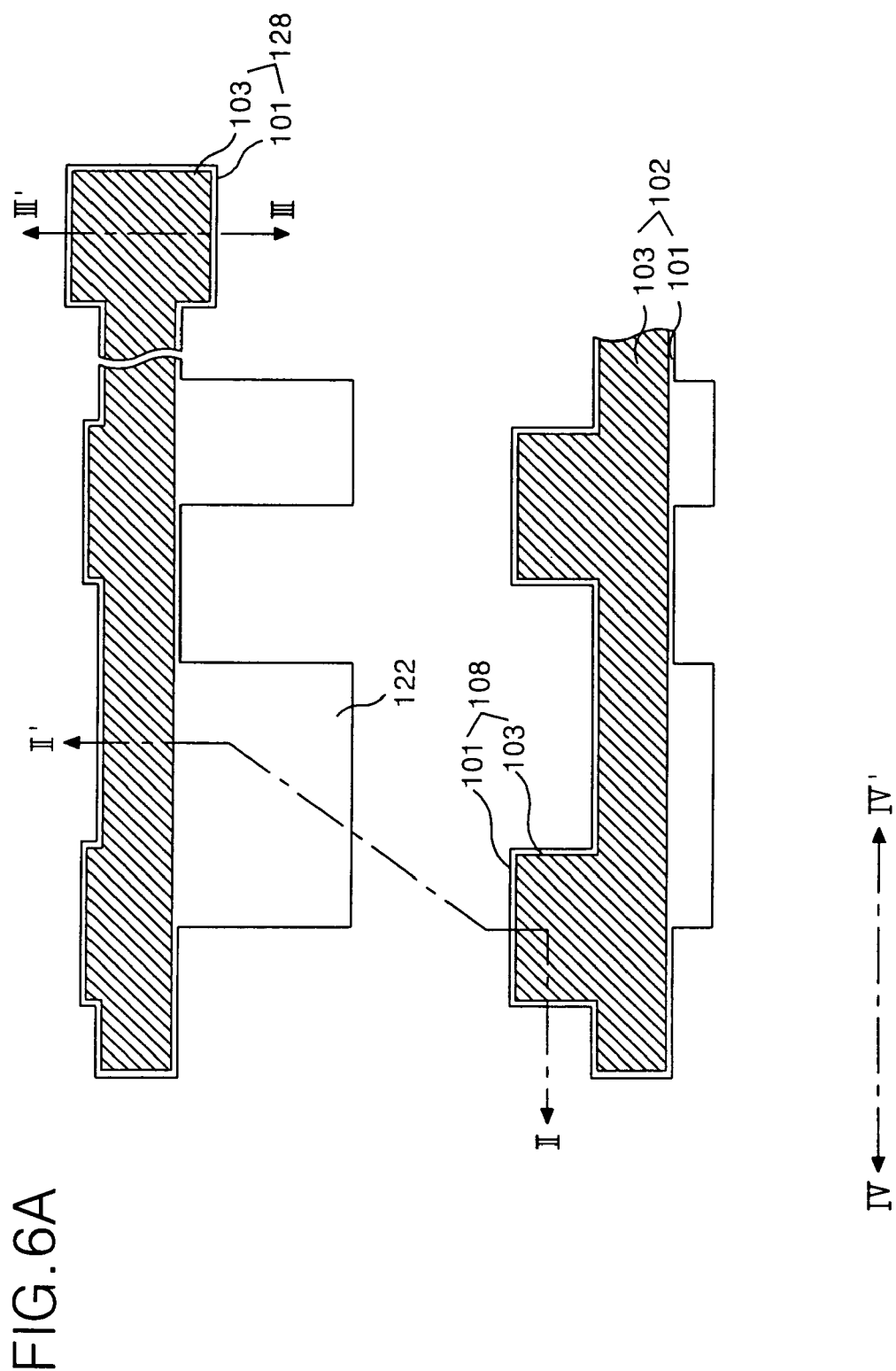

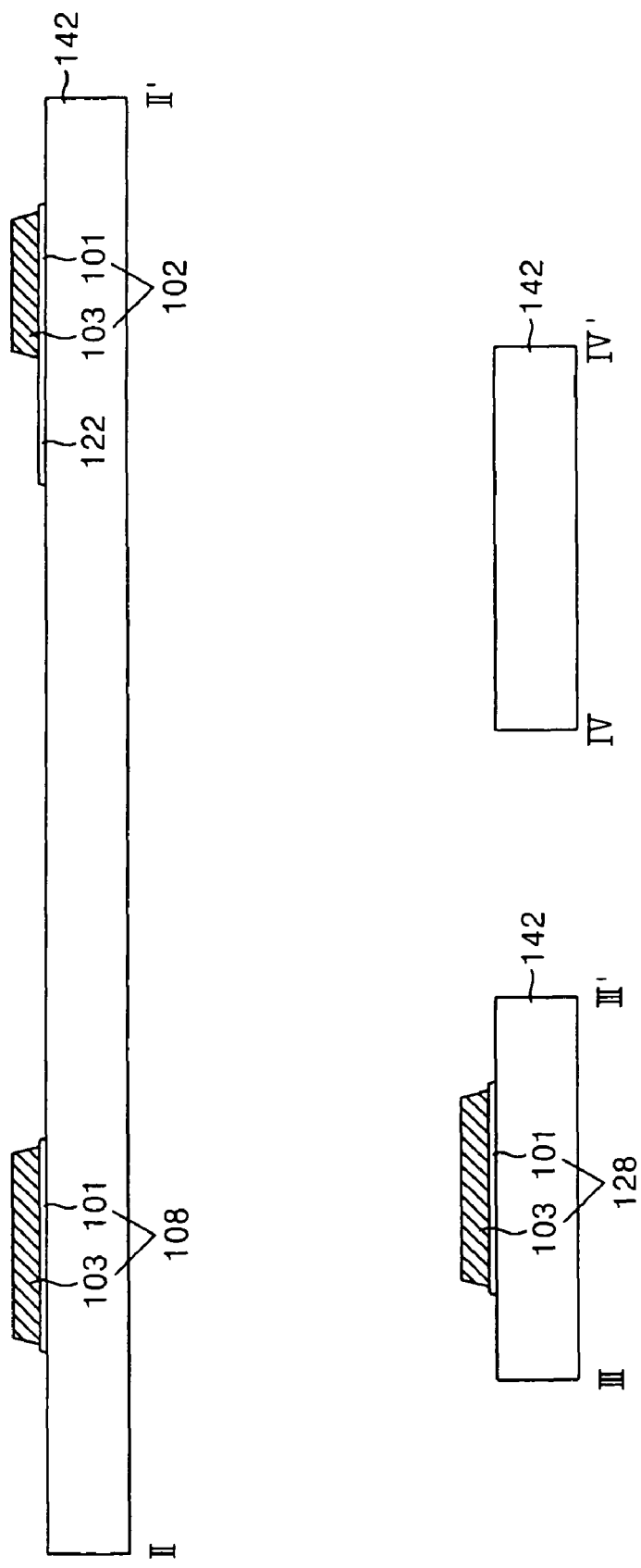

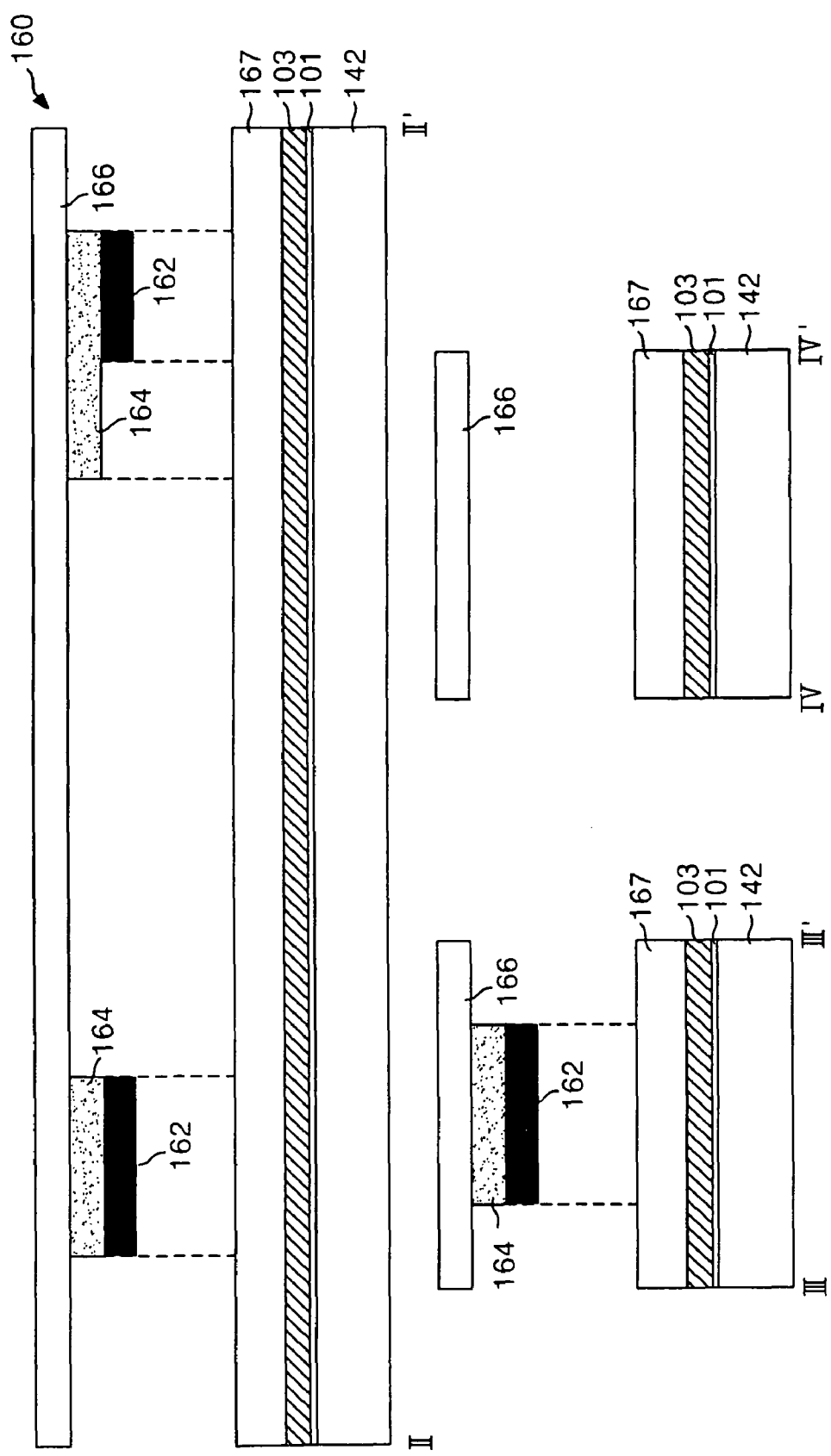

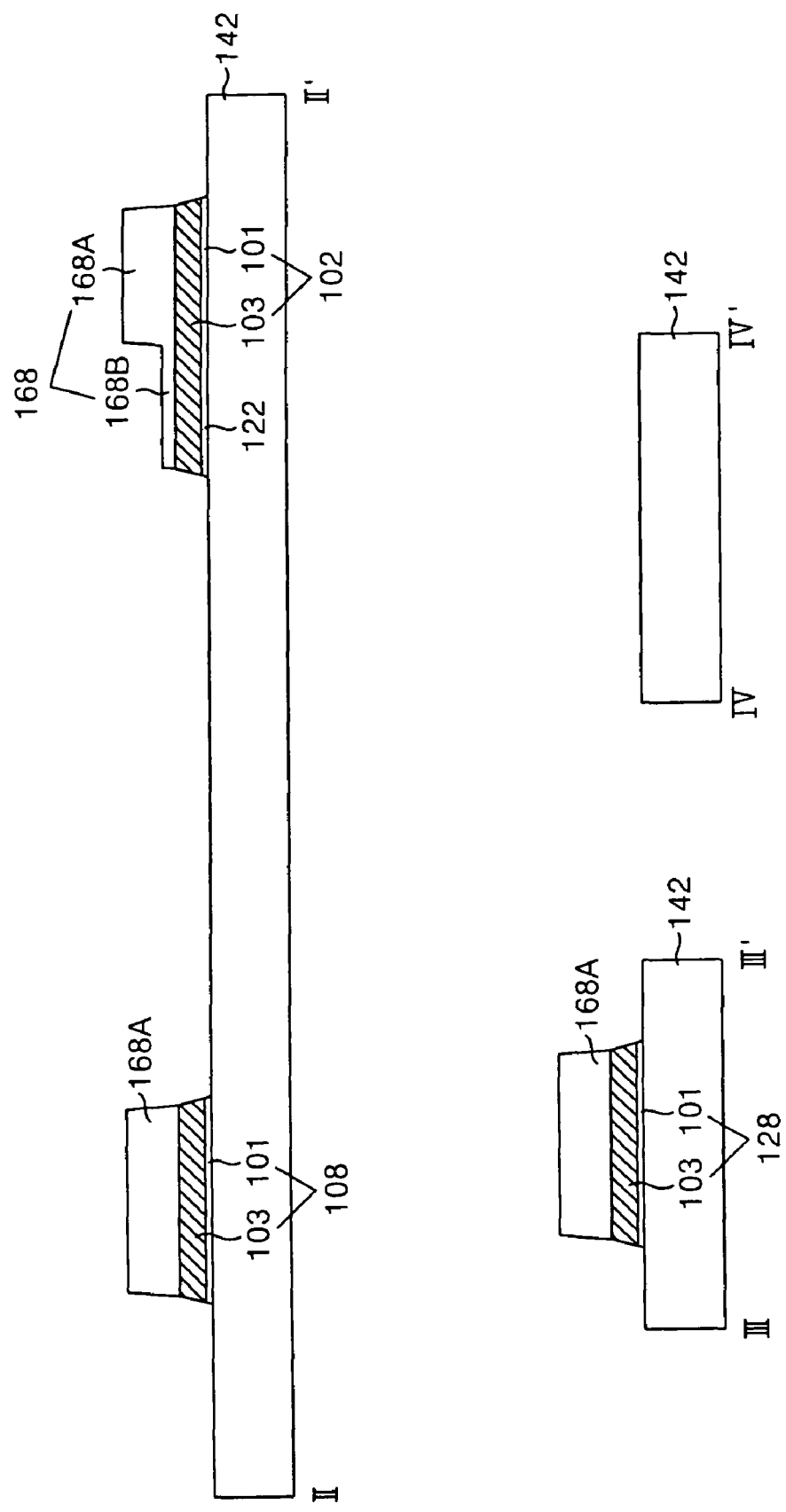

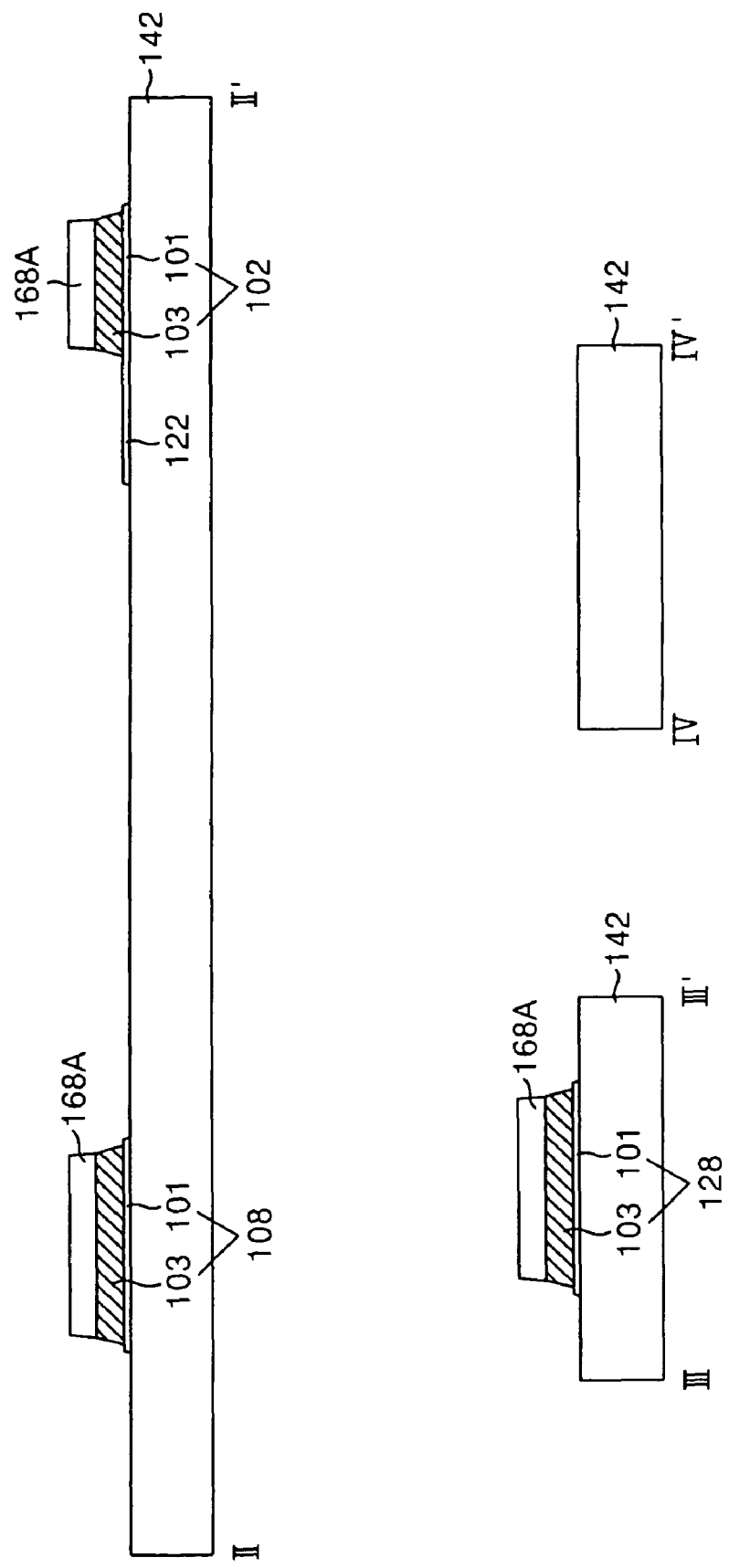

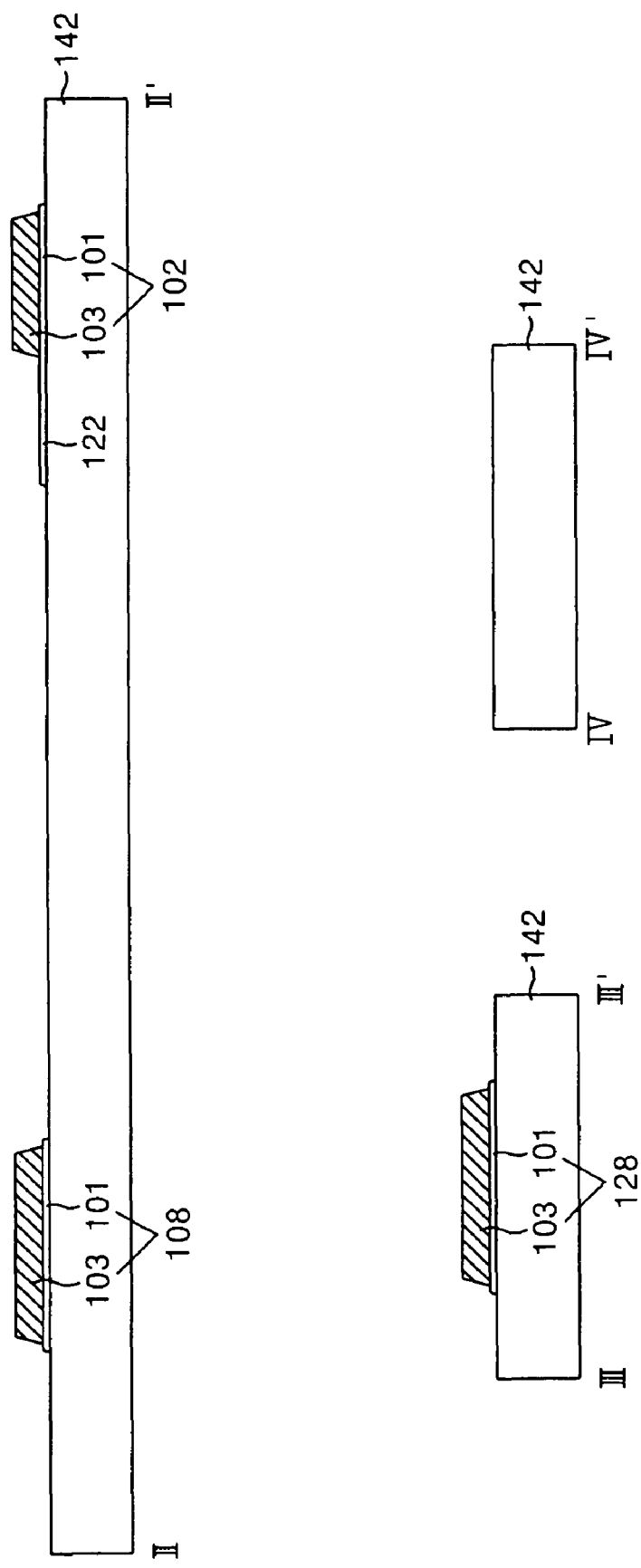

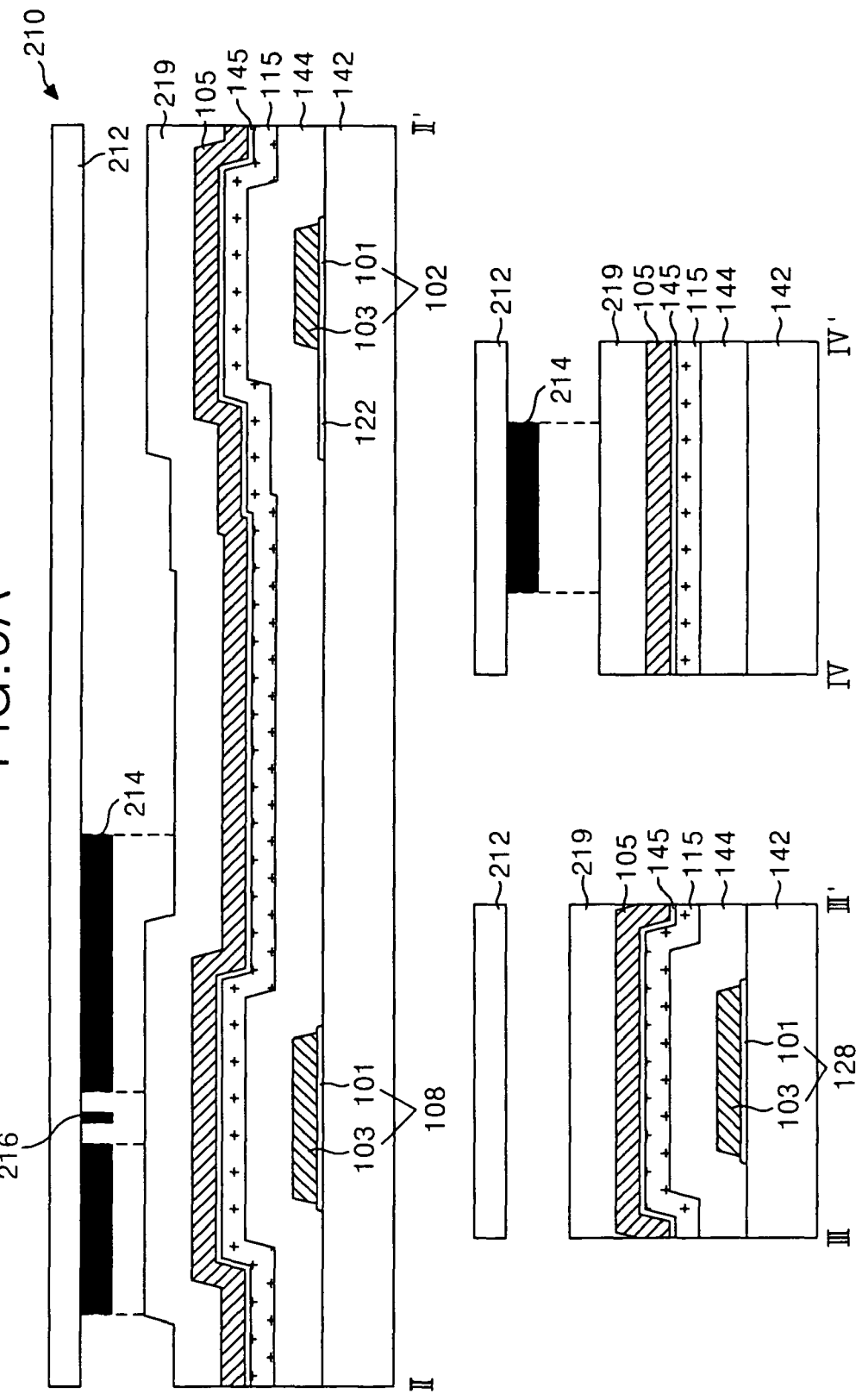

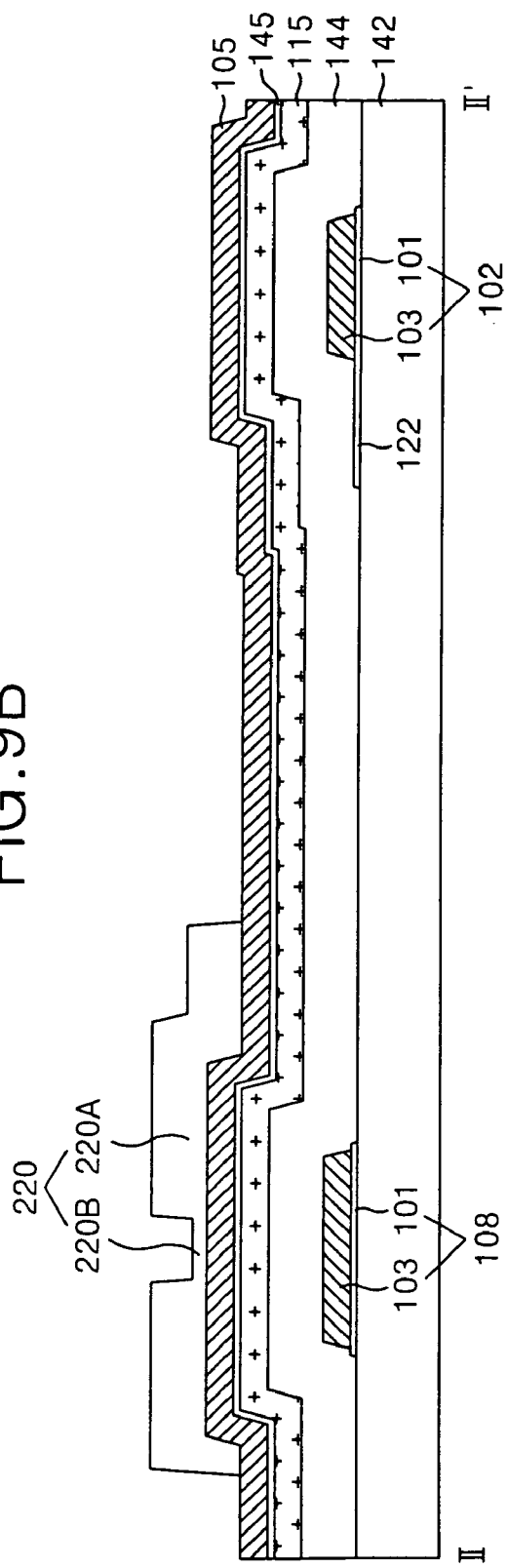
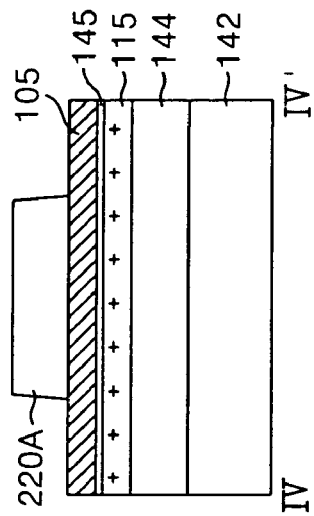
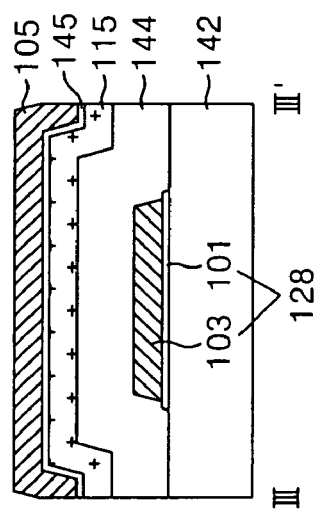
FIG.9B

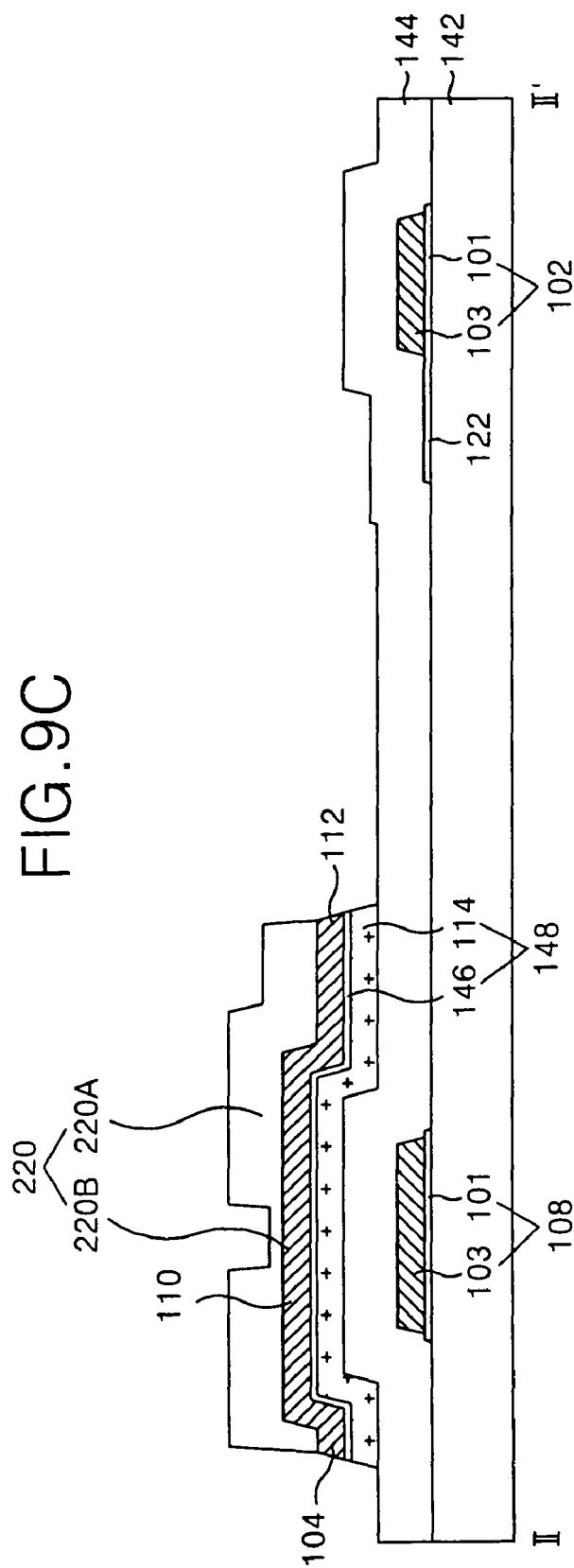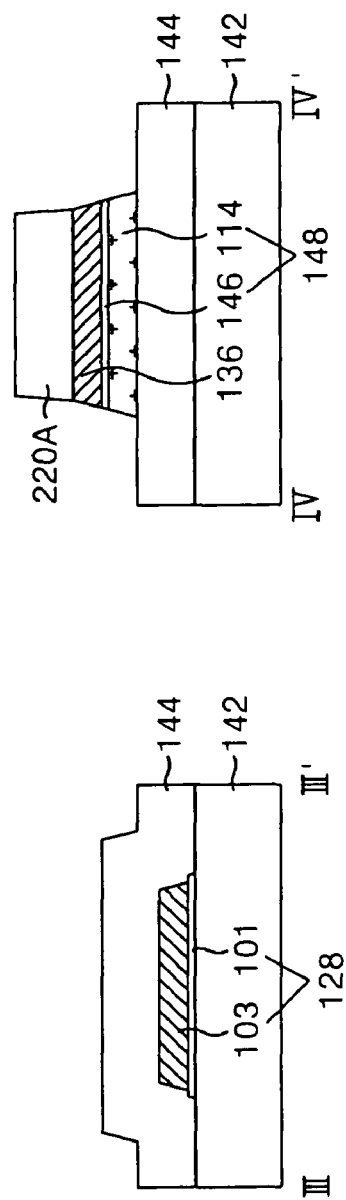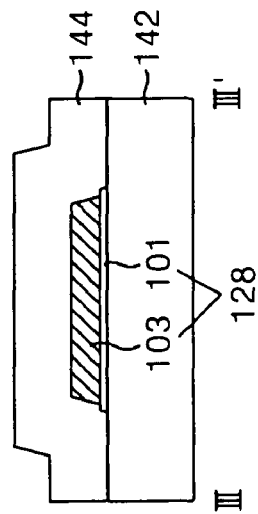
FIG.9C

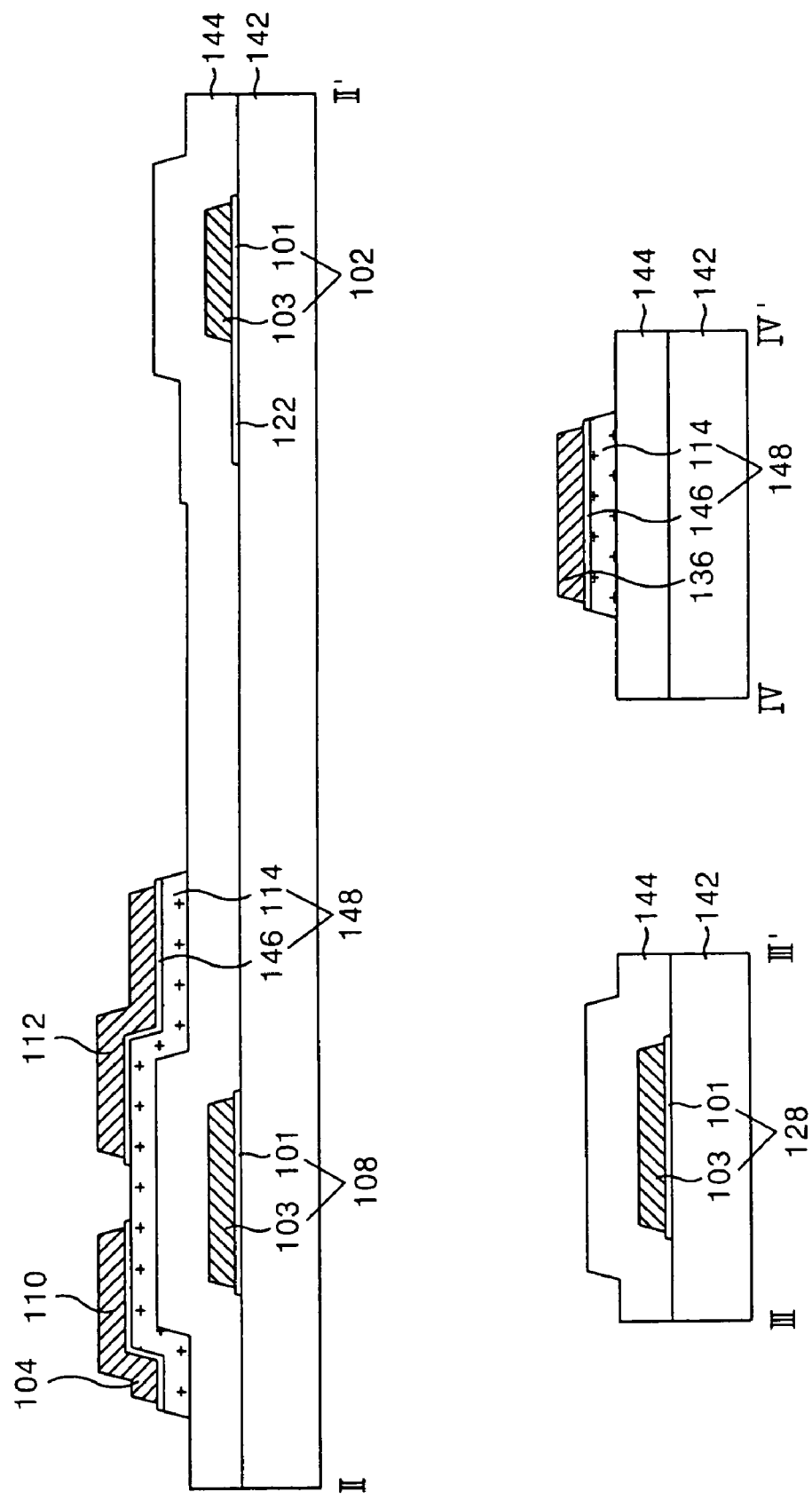

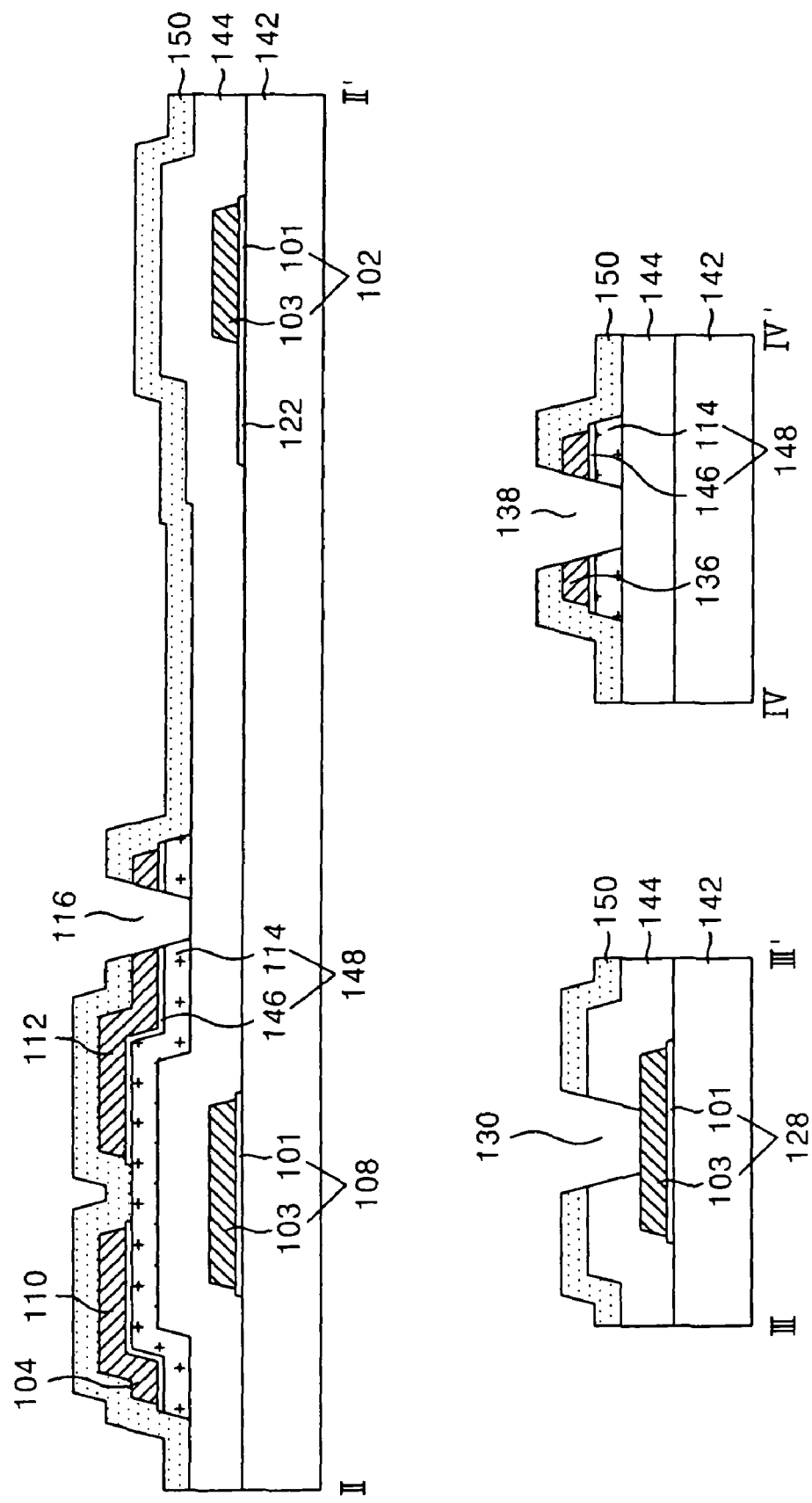

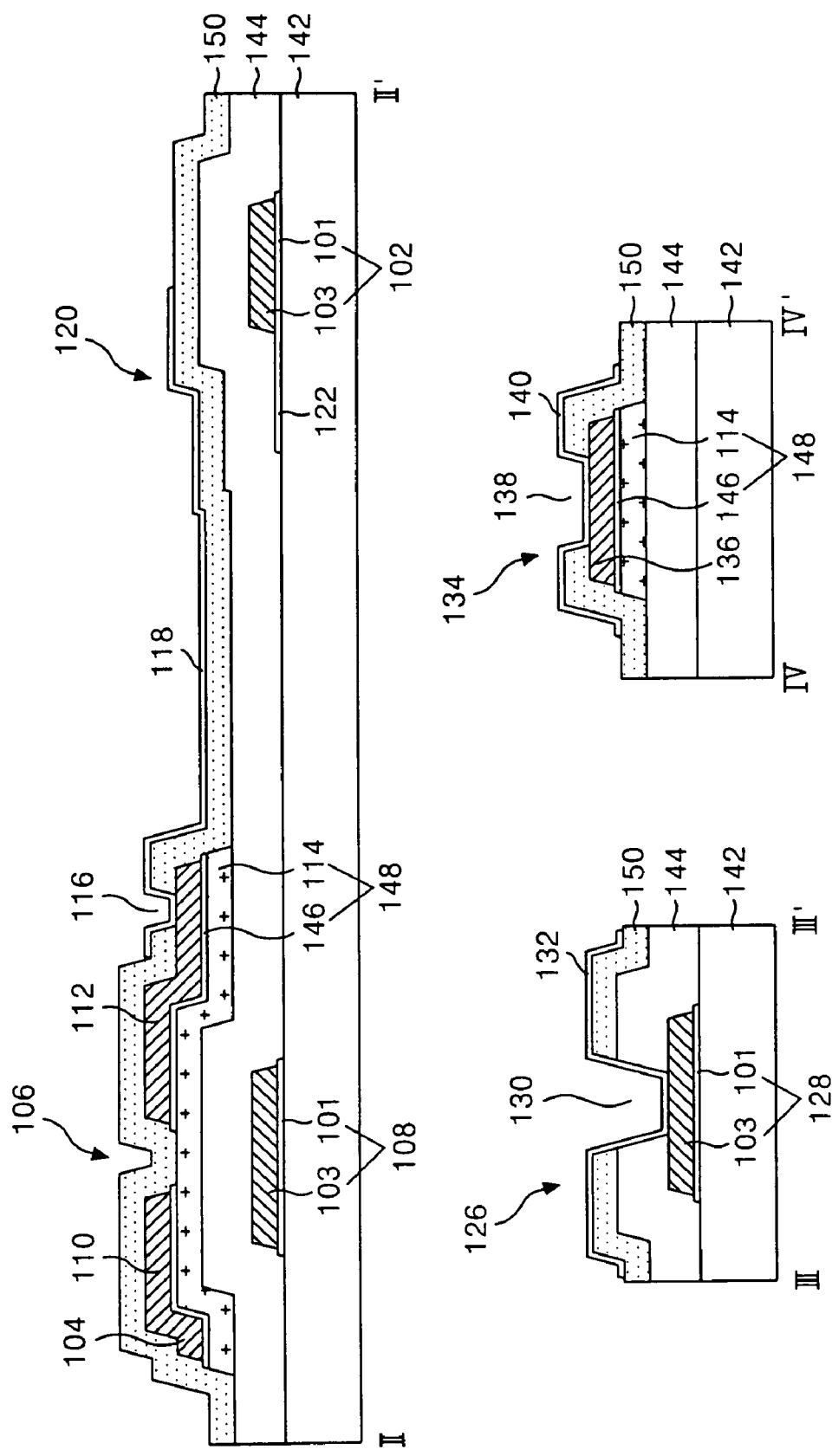

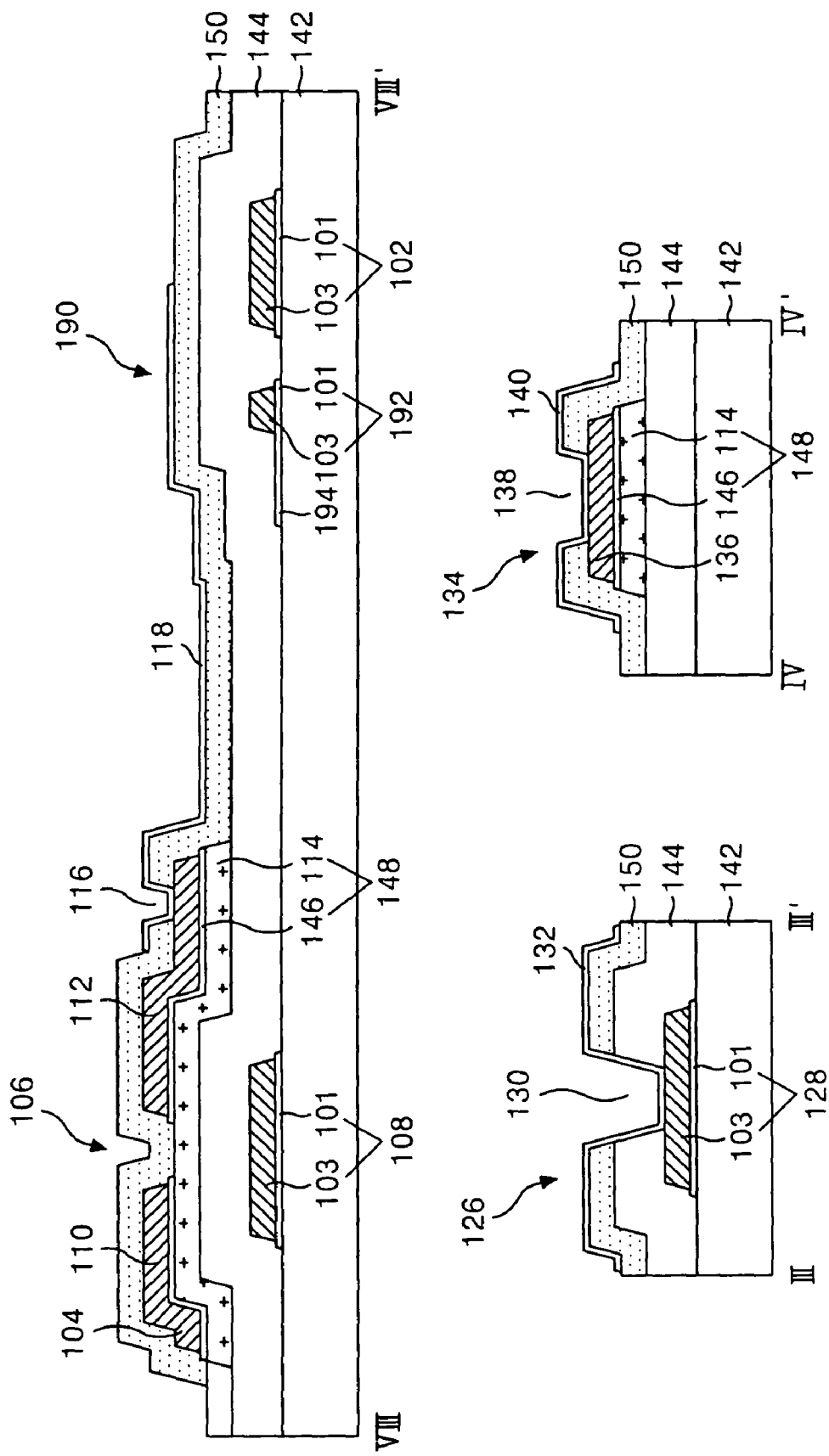

LIQUID CRYSTAL DISPLAY DEVICE

Cross-Reference To Related Applications

This application is a Divisional of application Ser. No. 11/137,426, filed May 26, 2005 now U.S. Pat. No. 7,351,623; which claims priority to Korean Patent Application No. 2004-37770, filed May 27, 2004, all of which are hereby incorporated by reference as if fully set forth herein.

This application claims the benefit of Korean Patent Application No. P2004-37770 filed in Korea on May 27, 2004, which is hereby incorporated by reference for all purposes as if fully set forth herein.

BACKGROUND OF THE INVENTION

1. Field of the Invention

This invention relates to a thin film transistor substrate applied to a display device, and more particularly to a thin film transistor substrate and a fabricating method thereof that are adaptive for simplifying a process.

2. Discussion of the Related Art

Generally, a liquid crystal display (LCD) controls light transmittance of a liquid crystal using an electric field to thereby display a picture. To this end, the LCD includes a liquid crystal display panel having liquid crystal cells arranged in a matrix, and a driving circuit for driving the liquid crystal display panel.

The liquid crystal display panel includes a thin film transistor substrate and a color filter substrate opposed to each other, a liquid crystal injected between two substrates, and a spacer maintaining cell gap between the two substrates.

The thin film transistor substrate includes gate lines, data lines, thin film transistors formed as switching devices for each crossing between the gate lines and the data lines, pixel electrodes formed for each liquid crystal cell and connected to the thin film transistor, and alignment films formed thereon. The gate lines and the data lines receive signals from the driving circuits via each pad portion. The thin film transistor applies a pixel signal fed to the data line to the pixel electrode in response to a scanning signal fed to the gate line.

The color filter substrate includes color filters formed for each liquid crystal cell, black matrices for dividing color filters and reflecting an external light, common electrodes for commonly applying reference voltages to the liquid crystal cells, and an alignment film formed thereon.

The liquid crystal display panel is completed by preparing the thin film array substrate and the color filter substrate individually to join them and then injecting a liquid crystal between them and sealing it.

In such a liquid crystal display device, the thin film transistor substrate has a complicated fabrication process that leads to a major rise in a manufacturing cost of the liquid crystal display panel because it involves a semiconductor process and needs a plurality of mask processes. In order to solve this, the thin film transistor substrate has been developed toward a reduction in the number of mask processes. This is because one mask process includes processes such as thin film deposition, cleaning, photolithography, etching, photo-resist stripping and inspection processes, etc. Recently, there has been highlighted a four-mask process excluding one mask process from the existent five-round mask process that was a standard mask process of the thin film transistor.

FIG. 1 is a plan view illustrating a thin film transistor substrate using a four-mask process, and FIG. 2 is a section view of the thin film transistor substrate taken along the I-I' line in FIG. 1.

In FIG. 1 and FIG. 2, the thin film transistor substrate includes a gate line 2 and a data line 4 provided on a lower substrate 42 in such a manner to cross each other while with having a gate insulating film 44 therebetween, a thin film transistor 6 provided at each crossing, and a pixel electrode 18 provided at a cell area having the crossing structure. Further, the thin film transistor substrate includes a storage capacitor 20 provided at an overlapped portion between the pixel electrode 18 and a previous gate line 2, a gate pad 26 connected to the gate line 2, and a data pad 34 connected to the data line 4.

The thin film transistor 6 allows a pixel signal applied to the data line 4 to be charged into the pixel electrode 18 and kept in response to a scanning signal applied to the gate line 2. To this end, the thin film transistor 6 includes a gate electrode 8 connected to the gate line 2, a source electrode 10 connected to the data line 4, a drain electrode 12 connected to the pixel electrode 18, and an active layer 14 overlapping with the gate electrode 8 and defining a channel between the source electrode 10 and the drain electrode 12.

The active layer 14 overlapping with the source electrode 10 and the drain electrode 12 and having a channel portion between the source electrode 10 and the drain electrode 12 also overlaps with the data line 4, a lower data pad electrode 36 and a storage electrode 22. On the active layer 14, an ohmic contact layer 48 for making an ohmic contact with the data line 4, the source electrode 10, the drain electrode 12, the lower data pad electrode 36 and the storage electrode 22 are further provided.

The pixel electrode 18 is connected, via a first contact hole 16 passing through a passivation film 50, to the drain electrode 12 of the thin film transistor 6. The pixel electrode 18 generates a potential difference with respect to a common electrode provided at an upper substrate (not shown) by the charged pixel signal. This potential difference rotates a liquid crystal positioned between the thin film transistor substrate and the upper substrate owing to a dielectric anisotropy and transmits a light input, via the pixel electrode 18, from a light source (not shown) toward the upper substrate.

The storage capacitor 20 includes a previous gate line 2, a upper storage electrode 22 overlapping the gate line 2 and having the gate insulating film 44, the active layer 14 and the ohmic contact layer 48 therebetween, and a pixel electrode 18 overlapping the upper storage electrode 22 and having the passivation film 50 therebetween and connected via a second contact hole 24 passing through the passivation film 50. The storage capacitor 20 allows a pixel signal charged in the pixel electrode 18 to be stably maintained until a next pixel voltage is charged.

The gate line 2 is connected, via the gate pad 26, to a gate driver (not shown). The gate pad 26 consists of a lower gate pad electrode 28 extended from the gate line 2, and an upper gate pad electrode 32 connected, via a third contact hole 30 passing through the gate insulating film 44 and the passivation film 50, to the lower gate pad electrode 28.

The data line 4 is connected, via the data pad 34, to the data driver (not shown). The data pad 34 includes a lower data pad electrode 36 extended from the data line 4, and an upper data pad electrode 40 connected, via a fourth contact hole 38 passing through the passivation film 50, to the lower data pad electrode 36.

Hereinafter, a method of fabricating the thin film transistor substrate having the above-mentioned structure using the four-mask process will be described in detail with reference to FIG. 3A to FIG. 3D.

In FIG. 3A, a gate pattern including the gate line 2, the gate electrode 8 and the lower gate pad electrode 28 is provided on the lower substrate 42 by the first mask process.

More specifically, a gate metal layer is formed on the lower substrate 42 by a deposition technique such as sputtering. Then, the gate metal layer is patterned by a photolithography and etching process using a first mask to thereby form a gate pattern including the gate line 2, the gate electrode 8 and the lower gate pad electrode 28. The gate metal layer may have a single-layer or double-layer structure of chrome (Cr), molybdenum (Mo) or an aluminum group metal, etc.

In FIG. 3B, the gate insulating film 44 is formed on the lower substrate 42 provided with the gate pattern. Further, a semiconductor pattern including the active layer 14 and the ohmic contact layer 48 and source/drain pattern including the data line 4, the source electrode 10, the drain electrode 12, the lower data pad electrode 36 and the storage electrode 22 are sequentially provided on the gate insulating film 44 by the second mask process.

More specifically, the gate insulating film 44, an amorphous silicon layer, a $n^+$ amorphous silicon layer and a source/drain metal layer are sequentially provided on the lower substrate 42 provided with the gate pattern by deposition techniques such as plasma enhanced chemical vapor deposition (PECVD) and sputtering, etc. Herein, the gate insulating film 44 is formed from an inorganic insulating material such as silicon nitride ($SiN_x$) or silicon oxide ($SiO_x$). The source/drain metal may be selected from molybdenum (Mo) or a molybdenum alloy, etc.

Then, a photo-resist pattern is formed on the source/drain metal layer by the photolithography using a second mask. In this case, a diffractive exposure mask having a diffractive exposing part at a channel portion of the thin film transistor is used as a second mask, thereby allowing a photo-resist pattern of the channel portion to have a lower height than other source/drain pattern portion.

Subsequently, the source/drain metal layer is patterned by a wet etching process using the photo-resist pattern to thereby provide the source/drain pattern including the data line 4, the source electrode 10, the drain electrode 12 being integral to the source electrode 10 and the storage electrode 22.

Next, the $n^+$ amorphous silicon layer and the amorphous silicon layer are patterned at the same time by a dry etching process using the same photo-resist pattern to thereby provide the ohmic contact layer 48 and the active layer 14.

The photo-resist pattern having a relatively low height is removed from the channel portion by a ashing process and thereafter the source/drain pattern and the ohmic contact layer 48 of the channel portion are etched by the dry etching process. Thus, the active layer 14 of the channel portion is exposed to disconnect the source electrode 10 from the drain electrode 12.

Then, the photo-resist pattern left on the source/drain metal pattern group is removed by a stripping process.

In FIG. 3C, the passivation film 50 including the first to fourth contact holes 16, 24, 30 and 38 are formed on the gate insulating film 44 provided with the source/drain pattern.

More specifically, the passivation film 50 is formed entirely on the gate insulating film 44 provided with the source/drain pattern by a deposition technique such as the plasma enhanced chemical vapor deposition (PECVD). Then, the passivation film 50 is patterned by the photolithography and etching process using a third mask to thereby define the first to fourth contact holes 16, 24, 30 and 38. The first contact hole 16 is formed in such a manner to pass through the passivation film 50 and expose the drain electrode 12, whereas the second contact hole 24 is formed in such a manner as to pass through the passivation film 50 and expose the upper storage electrode 22. The third contact hole 30 is formed in such a manner as to pass through the passivation film 50 and the gate insulating film 44 and expose the lower gate pad electrode 28. The fourth contact hole 38 is formed in such a manner as to pass through the passivation film 50 and expose the upper data pad electrode 36.

The passivation film 50 is formed of an inorganic insulating material identical to the gate insulating film 44, or an organic insulating material such as an acrylic organic compound having a small dielectric constant, BCB (benzocyclobutene) or PFCB (perfluorocyclobutane), etc.

In FIG. 3D, a transparent conductive pattern including the pixel electrode 18, the upper gate pad electrode 32 and the upper data pad electrode 40 is provided on the passivation film 50 by the fourth mask process.

A transparent conductive layer is formed on the passivation film 50 by a deposition technique such as sputtering, etc. Then, the transparent conductive layer is patterned by photolithography and an etching process using a fourth mask to thereby provide the transparent conductive pattern including the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the upper storage electrode 22 overlapping with a previous gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. Herein, the transparent conductive layer is formed of indium-tin-oxide (ITO), etc.

As described above, the related art thin film transistor substrate and the fabricating method uses a four-mask process, thereby reducing the number of processes and hence reducing manufacturing costs in proportion to the reduction in the number of processes.

However, in the related art thin film transistor substrate, the upper and lower electrodes of the storage capacitor 20 are formed of an opaque source/drain metal and an opaque gate metal, respectively. Thus, the problem arises in that, when an overlapping area between the upper storage electrode 22 and the gate line 2 is enlarged so as to increase a capacitance of the storage capacitor 20, an aperture ratio of the pixel electrode 18 is reduced.

SUMMARY OF THE INVENTION

Accordingly, the present invention is directed to liquid crystal display device and fabricating method thereof that substantially obviates one or more of the problems due to limitations and disadvantages of the related art.

An advantage of the present invention to provide a thin film transistor substrate and a fabricating method thereof that are adaptive for simplifying a process as well as enlarging a capacitance value of a storage capacitor without any reduction of aperture ratio.

In order to achieve these and other advantages of the invention, a liquid crystal display device according to an embodiment of the present invention includes: a double-layered gate line having a first transparent conductive layer and a second opaque conductive layer, the second opaque conductive layer having a step coverage; a gate insulation film on the gate line; a data line crossing the gate line to define a pixel region; a thin film transistor connected to the gate line and the data line; a pixel electrode connected to the thin film transistor via a contact hole of a protective film on the thin film transistor; and a storage capacitor overlapping the pixel electrode and having a lower storage electrode formed of the first transparent conductive layer.

In another embodiment of the present invention, a method of fabricating a liquid crystal display device includes: forming a gate pattern including a gate line, a gate electrode and a lower storage electrode on a substrate using a first mask, the gate line and the gate electrode being formed of a double-layer having a transparent conductive layer, and the lower storage electrode being formed of the transparent conductive layer; forming a gate insulating film on the gate pattern; forming a semiconductor pattern and a source/drain pattern having a data line and source and drain electrodes on the gate insulating film using a second mask, the data line defining a pixel region with the gate line; forming a protective film on the source and drain electrodes, and forming a contact hole exposing the drain electrode using a third mask; and forming a pixel electrode connected to the drain electrode via the contact hole on the protective film and overlapping with the lower storage electrode using a fourth mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6A and FIG. 6B are a plan view and a section view for explaining a first mask process of the thin film transistor substrate according to the embodiment of the present invention;

FIG. 7A to FIG. 7E are section views for specifically explaining the first mask process;

FIG. 9A to FIG. 9E are section views for specifically explaining the second mask process;

FIG. 10A to FIG. 10C are a plan view and section views for explaining a third mask process of the thin film transistor substrate according to the embodiment of the present invention;

FIG. 11A and FIG. 11B are a plan view and a section view for explaining a fourth mask process of the thin film transistor substrate according to the embodiment of the present invention;

FIG. 20 is a section view of the thin film transistor substrate taken along the III-III', IV-IV' and VIII-VIII' lines in FIG. 19.

DETAILED DESCRIPTION OF THE ILLUSTRATED EMBODIMENTS

Reference will now be made in detail to embodiments of the present invention, examples of which are illustrated in the accompanying drawings.

Figure 1:
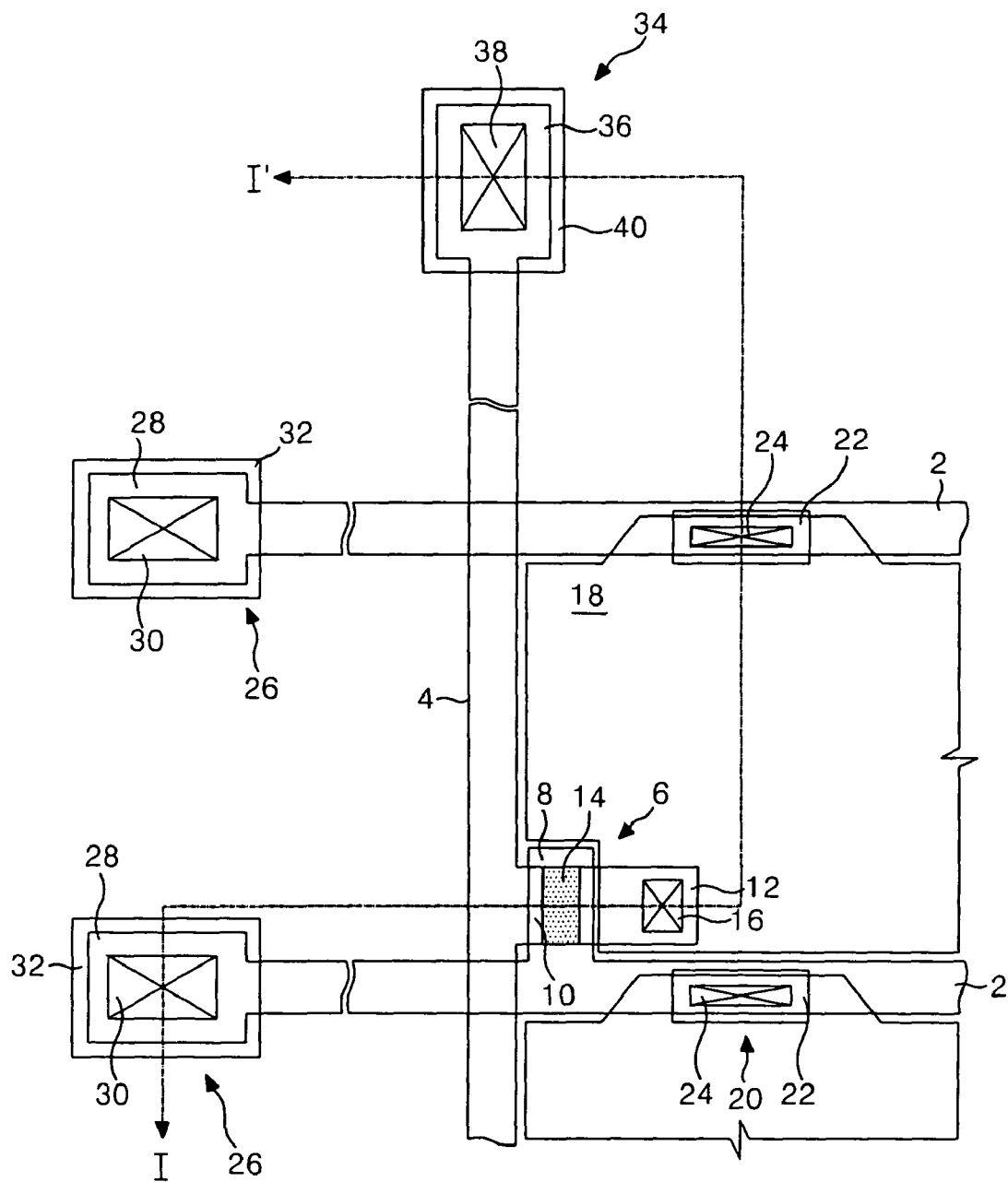
FIG. 1 is a plan view showing a portion of a related art thin film transistor substrate.
Figure 2:
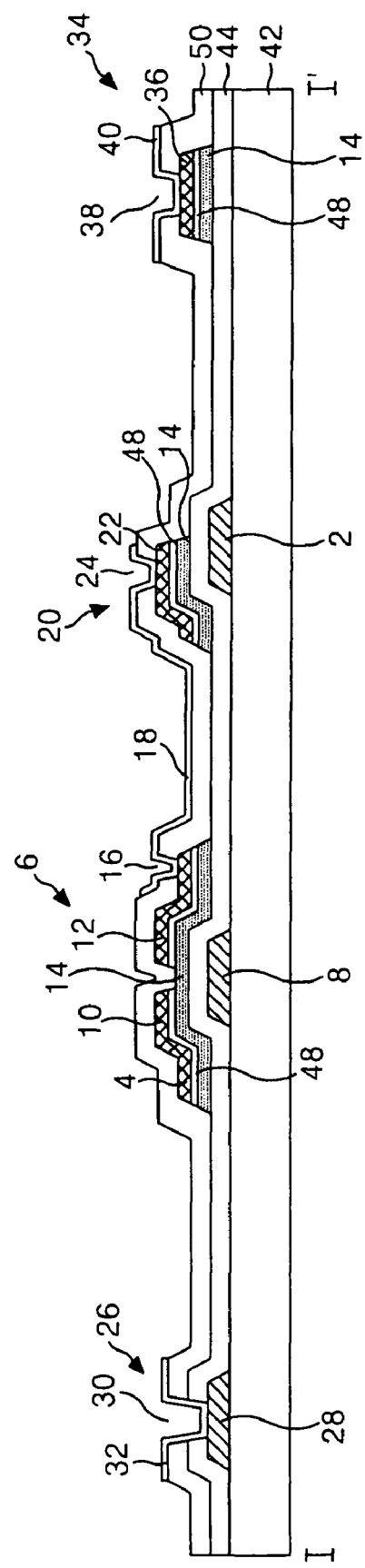
FIG. 2 is a section view of the thin film transistor substrate taken along the I-I' line in FIG. 1.
Figure 3A:
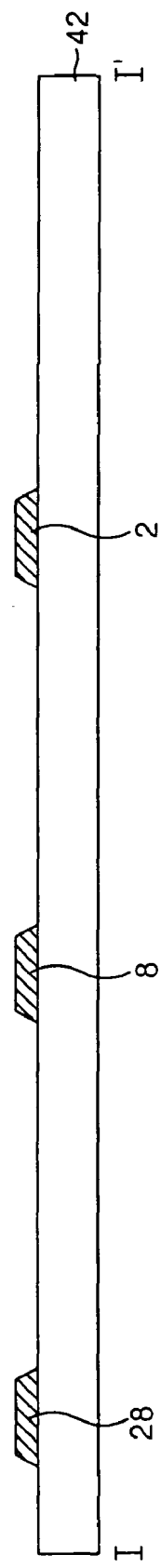
FIG. 3A to FIG. 3D are section views illustrating a method of fabricating the thin film transistor substrate shown in FIG. 2.
Figure 3B:
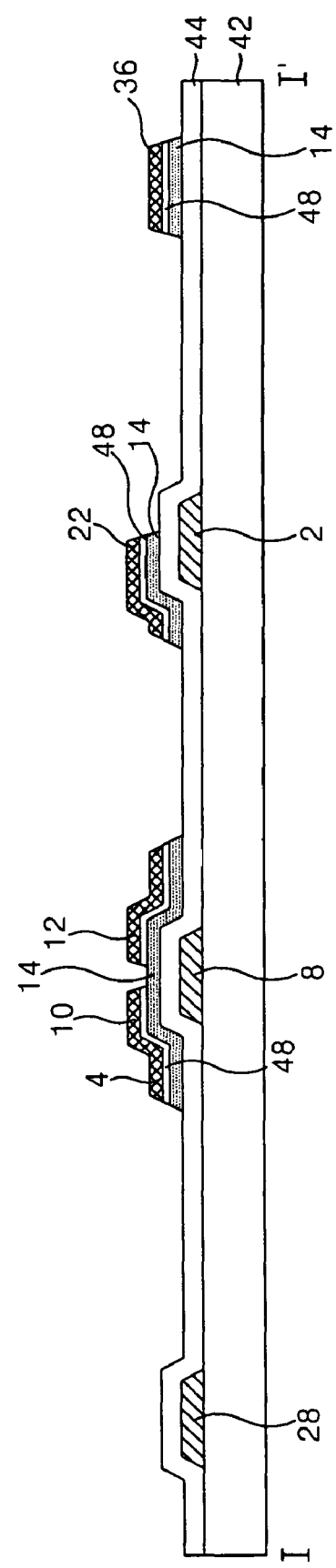
Figure 3C:
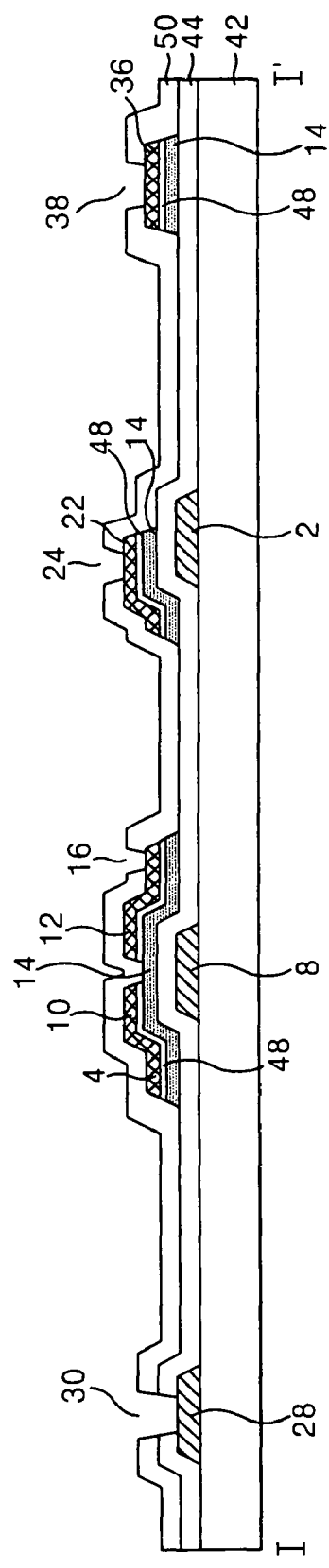
Figure 3D:
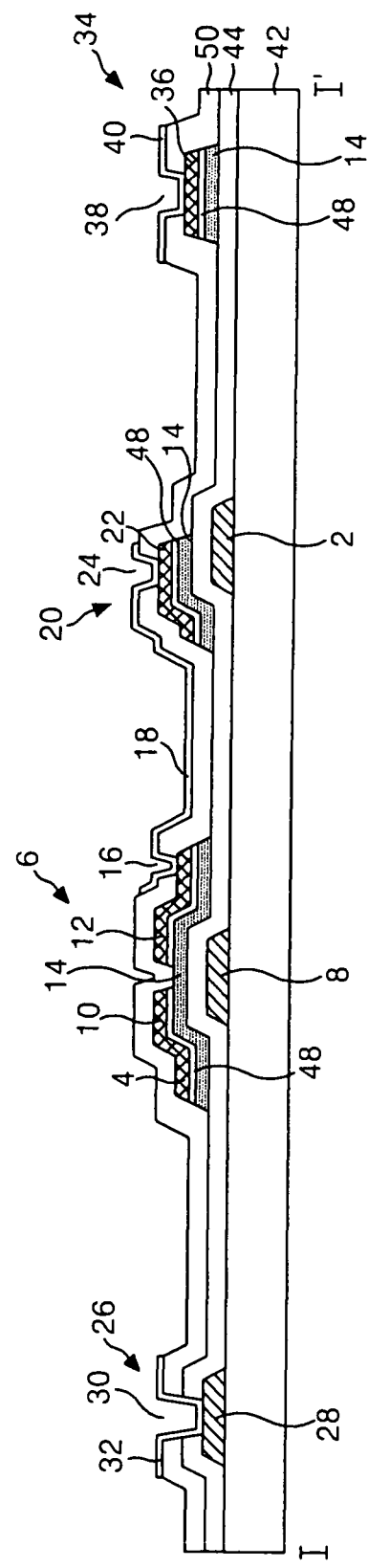
Figure 4:
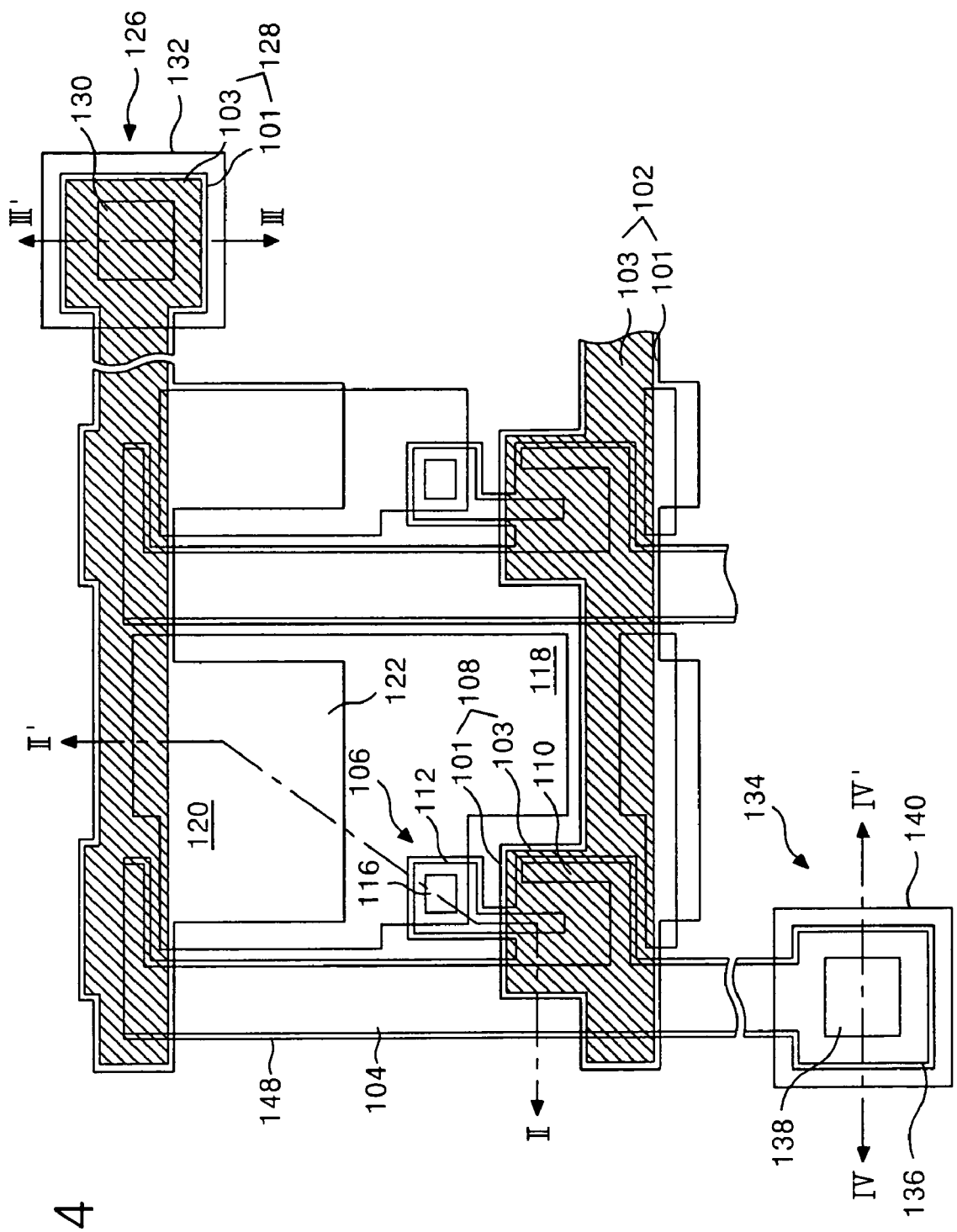
FIG. 4 is a plan view showing a portion of a thin film transistor substrate according to an embodiment of the present invention.
Figure 5:
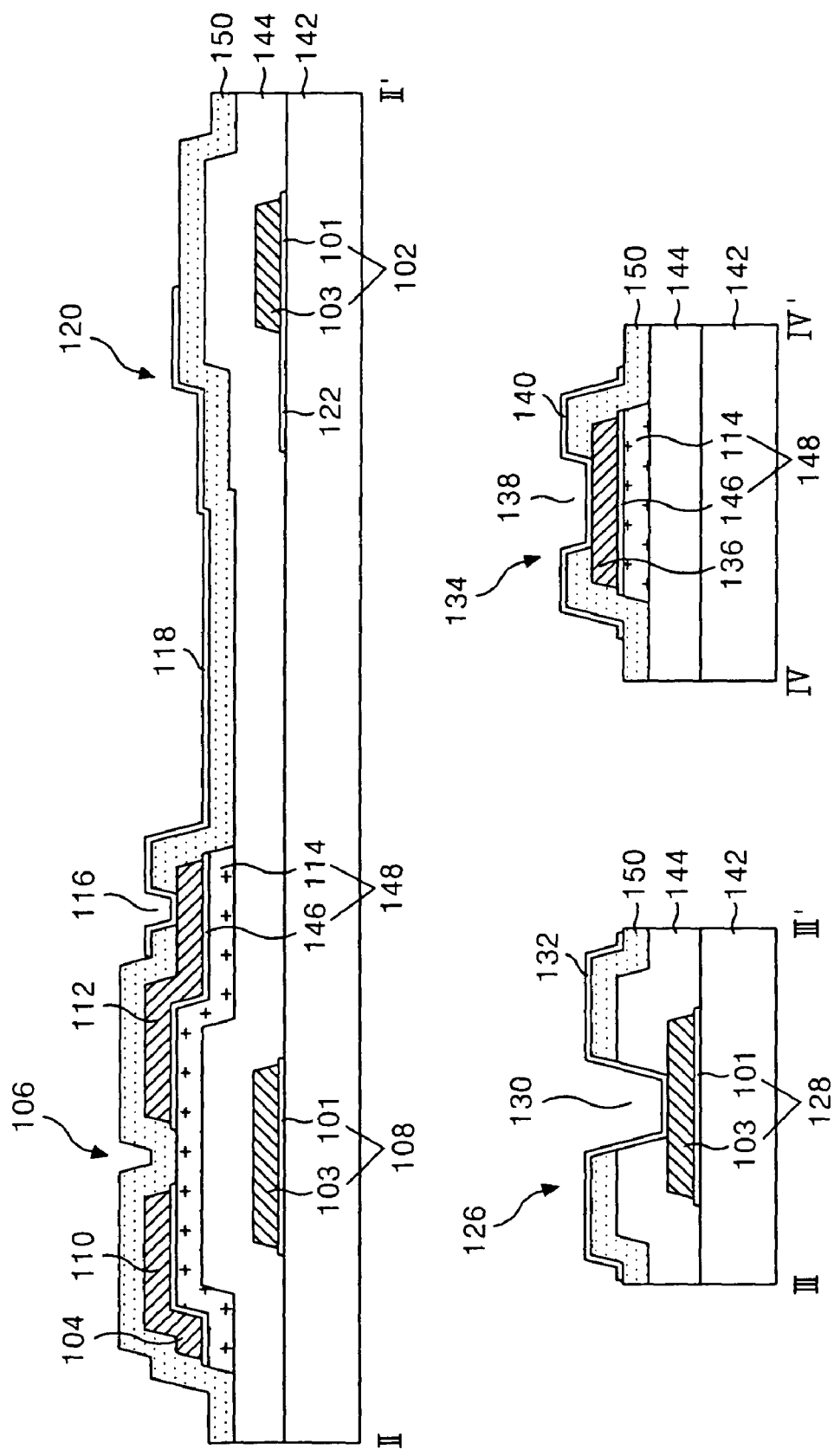
FIG. 5 is a section view of the thin film transistor substrate taken along the II', III-III' and IV-IV' lines in FIG. 4.

FIG. 4 is a plan view showing a portion of a thin film transistor substrate according to an embodiment of the present invention, and FIG. 5 is a section view of the thin film transistor substrate taken along the II-II', III-III' and IV-IV' lines in FIG. 4.

In FIG. 4 and FIG. 5, the thin film transistor substrate includes a gate line 102 and a data line 104 provided on a lower substrate 142 in such a manner as to cross each other, the data line 104 and gate line 102 having a gate insulating film 144 therebetween, a thin film transistor 106 being adjacent to each crossing, and a pixel electrode 118 provided at a pixel area defined by the crossing structure. Further, the thin film transistor substrate includes a storage capacitor 120 provided at an overlapped portion between the pixel electrode 118 and a lower storage electrode 122 connected to a previous gate line 102, a gate pad 126 connected to the gate line 102, and a data pad 134 connected to the data line 104.

The thin film transistor 106 allows a pixel signal applied to the data line 104 to be charged into the pixel electrode 118 and be kept in response to a scanning signal applied to the gate line 102. To this end, the thin film transistor 106 includes a gate electrode 108 connected to the gate line 102, a source electrode 110 connected to the data line 104, a drain electrode 112 positioned opposite the source electrode 110 and connected to the pixel electrode 118, an active layer 114 overlapping with the gate electrode 108 with having the gate insulating film 144 therebetween to define a channel between the source electrode 110 and the drain electrode 112, and an ohmic contact layer 146 formed on the active layer 114 other than the channel portion to make an ohmic contact with the source electrode 110 and the drain electrode 112.

Herein, the gate line 102 and the gate electrode 108 have a double-layered structure in which a first conductive layer 101 formed from a transparent conductive layer and a second conductive layer 103 formed from a metal layer thereon are disposed.

Further, the semiconductor pattern 148 including the active layer 114 and the ohmic contact layer 146 also overlap with the data line 104.

A pixel area defined by a crossing between the gate line 102 and the data line 104 is provided with a pixel electrode 118. The pixel electrode 118 is connected, via a first contact hole 116 passing through the passivation film 150, to the drain electrode 112. Such a pixel electrode 118 charges a pixel signal supplied from the thin film transistor 106 to thereby generate a potential difference with respect to a common electrode provided at a color filter substrate (not shown). This potential difference rotates a liquid crystal positioned between the thin film transistor substrate and the color filter substrate based on a dielectric anisotropy and controls an amount of a light input, via the pixel electrode 118, from a light source (not shown) to thereby transmit it into the color filter substrate.

The storage capacitor 120 is formed such that the lower storage electrode 122 protruded from the first conductive layer 101 toward the pixel area overlaps with the pixel electrode 118 with the gate insulating film 144 and the passivation film 150 therebetween. The lower storage electrode 122 is formed from the first conductive layer 101, that is, a transparent conductive layer, so that an overlapping area between it and the pixel area can be enlarged without a reduction of aperture ratio. Accordingly, it becomes possible to increase a capacitance of the storage capacitor 120 without any reduction of aperture ratio, and hence to keep the signal charged in the pixel electrode 118 more stable.

The gate line 102 is connected, via the gate pad 126, to a gate driver (not shown). The gate pad 126 includes a lower gate pad electrode 128 extended from the gate line 102, and an upper gate pad electrode 132 connected, via a second contact hole 130 passing through the passivation film 150 and the gate insulating film 144, to the lower gate pad electrode 128. The lower gate pad electrode 128 has a double-layered structure in which the first and second conductive layers 101 and 103 are formed like the gate line 102.

The data line 104 is connected, via a data pad 134, to a data driver (not shown). The data pad 134 consists of a lower data pad electrode 136 extended from the data line 104, and an upper data pad electrode 140 connected, via a third contact hole 138 passing through the passivation film 150, to the lower data pad electrode 136. The semiconductor layer 148 including the ohmic contact layer 146 and the active layer 114 is formed under the lower data pad electrode 136 in such a manner to overlap with it.

As described above, the thin film transistor substrate according to the embodiment of the present invention forms the lower storage electrode 122, overlapped by the pixel electrode 118, from a transparent conductive layer, so that a capacitance of the storage capacitor 120 can be increased without any reduction of aperture ratio. Accordingly, a line width of the gate line 102 can be reduced independently of an overlapping area between the gate line 102 and the pixel electrode 118, thereby having an advantage in making a high definition.

The thin film transistor substrate according to the embodiment of the present invention having the above-mentioned structure is formed by the following four-mask process.

FIG. 6A and FIG. 6B are a plan view and a section view, respectively, for explaining a first mask process in a method of fabricating the thin film transistor substrate according to the embodiment of the present invention, and FIG. 7A to FIG. 7E are section views specifically explaining the first mask process.

A gate pattern including the gate line 102, the gate electrode 108 connected to the gate line 102, the lower gate pad electrode 128 and the lower storage electrode 122 is formed on the lower substrate 142 by a first mask process. The gate line 102, the gate electrode 108 and the lower gate pad electrode 128 have a double-layered structure in which the first and second conductive layers 101 and 103 are formed, whereas the lower storage electrode 122 has a single-layered structure in which the first conductive layer 101 of the gate line 102 is extended. The gate pattern having the above-mentioned double-layered and single-layered structure is formed by a single mask process using a half tone mask 160.

More specifically, as shown in FIG. 7A, the first and second conductive layers 101 and 103 are formed on the lower substrate 142 by a deposition technique such as sputtering, and a photo-resist 176 is formed thereon. The first conductive layer 101 is formed of a transparent conductive material such as indium-tin-oxide (ITO), tin-oxide (TO), indium-zinc-oxide (IZO) or the like. The second conductive layer 103 is formed of a metal material such as Mo, Cu, Al, Ti, Cr, MoW or AlNd, etc.

Figure 7B:
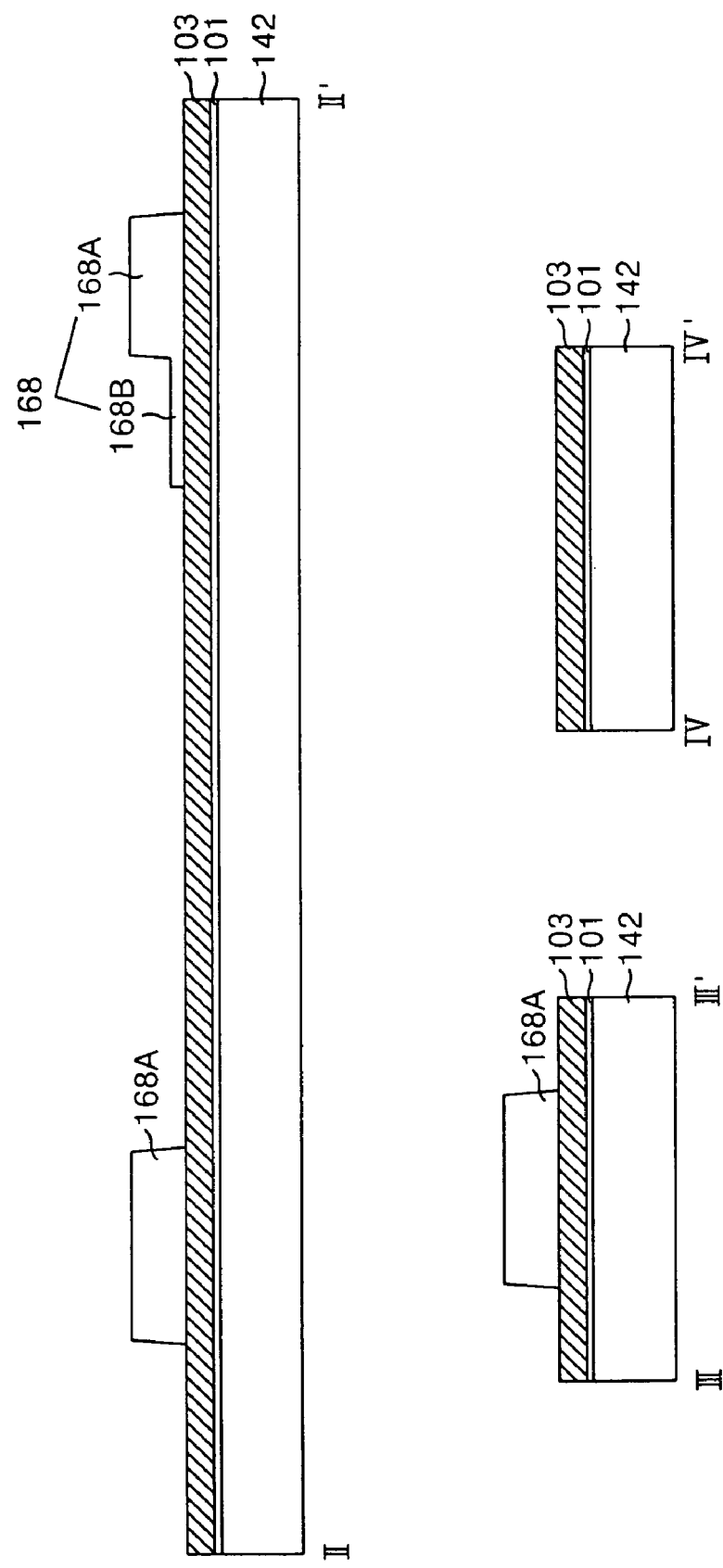

Next, the photo-resist 167 is exposed to light and developed by photolithography using a half tone mask 160, thereby forming a photo-resist pattern 168 having a step coverage as shown in FIG. 7B.

The half tone mask 160 includes a transparent quartz ($SiO_2$) substrate 166, and a shielding layer 162 and a partial transmitting layer 164 formed thereon. Herein, the shielding layer 162 is positioned at an area to be provided with a gate pattern to shut off an ultraviolet ray (UV), thereby leaving a first photo-resist pattern 168A after a development thereof. The partial transmitting layer 164 is positioned at an area to be provided with the lower storage electrode to partially transmit the UV, thereby leaving a second photo-resist pattern 168B thinner than the first photo-resist pattern 168A. To this end, the shielding layer 162 is formed of a metal such as Cr, $CrO_x$ or the like, whereas the partial transmitting layer 164 is made from $MoSi_x$. Besides the half tone mask, a diffractive exposure mask also is applicable.

Subsequently, the first and second conductive layers 101 and 103 are patterned by an etching process using the photo-resist pattern 168 having a step coverage to thereby provide a double-layer structure of gate pattern as shown in FIG. 7C.

Then, the photo-resist pattern 168 is ashed by an ashing process using an oxygen ($O_2$) plasma to thereby thin the thickness of the first photo-resist pattern 168A and remove the second photo-resist pattern 168B as shown in FIG. 7D. Further, the second conductive layer 103 on the lower storage electrode 122 is removed by an etching process using the ashed first photo-resist pattern 168A. Thus, the lower storage electrode 122 can be formed from only the first conductive layer 101 without a miss-alignment to the second conductive layer 103 included in the gate line 102. At this time, each side of the second conductive layer 103 patterned along the ashed first photo-resist pattern 168A is once more etched, thereby allowing the first and second conductive layers 101 and 103 of the gate pattern to have a certain step coverage in a stepwise shape. Accordingly, when the side surfaces of the first and second conductive layers 101 and 103 have a high steep slope, it becomes possible to prevent a breakage badness of the source/drain metal layer that may be generated thereon.

Meanwhile, the etching process of the first and second conductive layers 101 and 103 may selectively employ wet etching or dry etching. For instance, if all the first and second conductive layers 101 and 103 are etched, then the etching process of the first and second layers 101 and 103 as shown in FIG. 7C; and the ashing process of the photo-resist pattern and the etching process of the exposed second conductive layer 103 as shown in FIG. 7D are successively performed at the same chamber, so that an advantage of a process simplification can be obtained.

Alternatively, the etching process of the exposed second conductive layer 103 may employ wet etching. In another example, the first and second conductive layers 101 and 103 may employ wet etching as shown in FIG. 7C, and both the ashing process and the etching process of the exposed second conductive layer 103 may employ a dry etching or the etching process of the exposed second conductive layer 103 only may employ a wet etching as shown in FIG. 7D. Otherwise, the second conductive layer 103 performs a wet etching while the first conductive layer 101 performs a dry etching, or the second conductive layer 103 performs a dry etching and the first conductive layer 101 performs a wet etching; and thereafter both the ashing process and the etching process of the exposed second conductive layer 103 employ a dry etching or only the etching process of the exposed second conductive layer 103 employs a wet etching.

Accordingly, dry etching is advantageous when it is applied to a high-definition model, whereas wet etching is advantageous when it is applied to a high-dimension model. Further, dry etching is advantageous when the second conductive layer 103 is formed of Mo, whereas a wet etching is advantageous when the second conductive layer 103 is made from Cu or Al.

Consequently, the photo-resist pattern 168A left on the gate pattern is removed by the stripping process as shown in FIG. 7E.

Figure 8A:
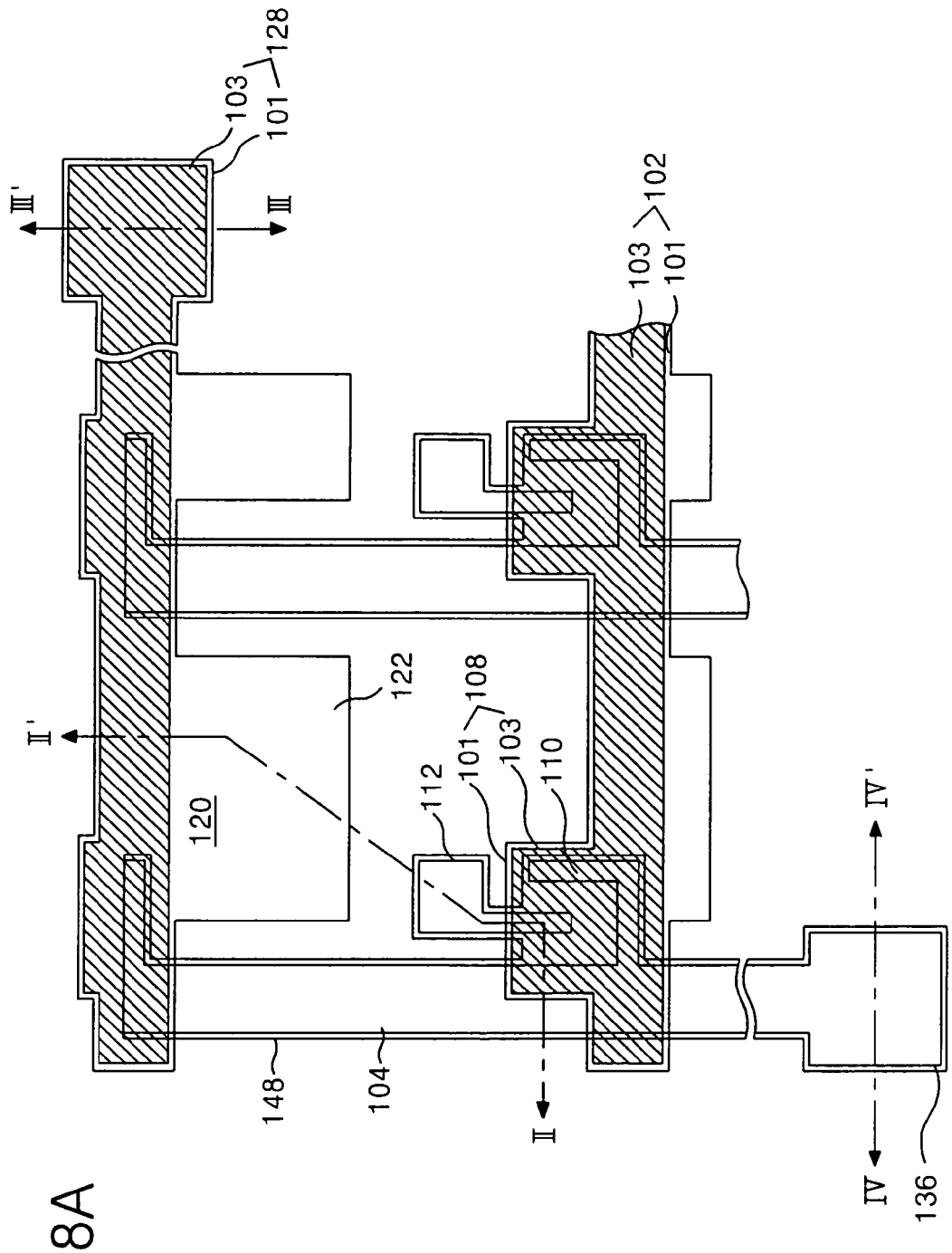
FIG. 8A and FIG. 8B are a plan view and a section view for explaining a second mask process of the thin film transistor substrate according to the embodiment of the present invention.
Figure 8B:
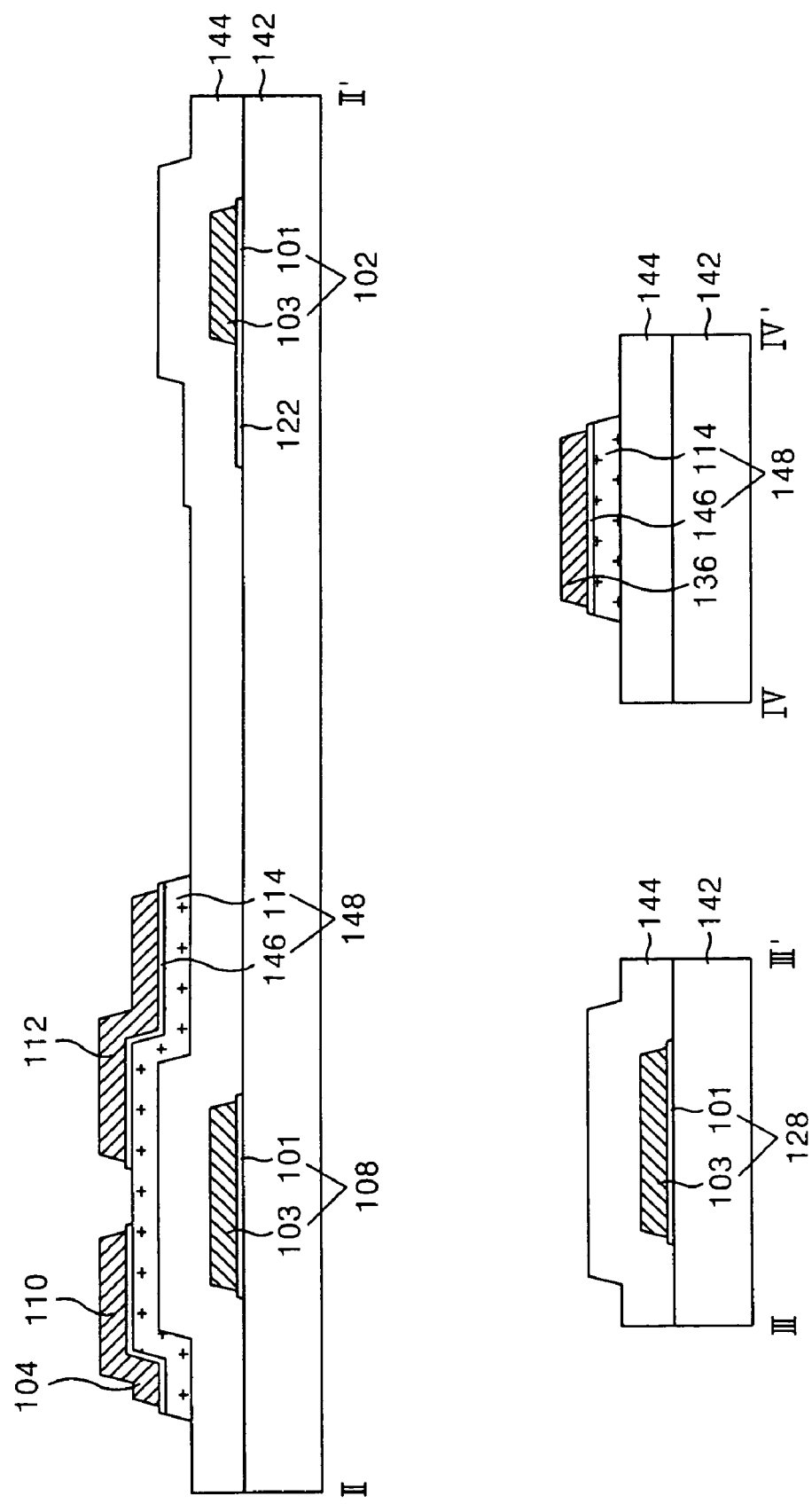

FIG. 8A and FIG. 8B are a plan view and a section view for explaining a second mask process, respectively, in a method of fabricating the thin film transistor substrate according to an embodiment of the present invention, and FIG. 9A to FIG. 9E are section views explaining the second mask process in detail.

First, the gate insulating film 144 is formed on the lower substrate 142 provided with the gate pattern. Further, the source/drain pattern including the data line 104, the source electrode 110, the drain electrode 112 and the lower data pad electrode 136 and the semiconductor pattern 148 including the active layer 114 and the ohmic contact layer 146 overlapping each other along the rear side of the source/drain pattern are formed thereon by the second mask process. The semiconductor pattern 148 and the source/drain pattern are formed by a single mask process using a diffractive exposure mask.

More specifically, as illustrated in FIG. 9A, the gate insulating film 144, an amorphous silicon layer 115, an amorphous silicon layer 145 being doped with n$^+$ or p$^+$ impurity and the source/drain metal layer 105 are sequentially formed on the lower substrate 142 provided with the gate pattern. For instance, the gate insulating film 144, the amorphous silicon layer 115 and the amorphous silicon doped with the impurity may be formed by PECVD, whereas the source/drain metal layer 105 is formed by sputtering. The gate insulating film 144 is formed of an inorganic insulating material such as silicon nitride (SiN$_x$) or silicon oxide (SiO$_x$), whereas the source/drain metal layer 105 is formed of Cr, MoW, Al/Cr, Cu, Al(Nd), Al/Mo, Al(Nd)/Al, Al(Nd)/Cr, Mo/Al(Nd)/Mo, Cu/Mo or Ti/Al(Nd)/Ti, etc. For example, a double layer of Al/Cr means that Cr should be formed first and Al should be formed later.

Further, a photo-resist 219 is formed on the source/drain metal layer 105 and then is exposed to the light and developed by photolithography using a diffractive exposure mask 210, thereby providing a photo-resist pattern 220 having a step coverage as shown in FIG. 9B.

The diffractive exposure mask 210 includes a transparent quartz substrate 212, a shielding layer 214 formed from a metal layer such as Cr, CrO$_x$ or the like, and a diffractive exposure slit 216. The shielding layer 214 is positioned at an area to be provided with the semiconductor pattern and the source/drain pattern to shut off an ultraviolet ray (UV), thereby leaving a first photo-resist pattern 220A after a development thereof. The diffractive exposure slit 216 is positioned at an area to be provided with a channel of the thin film transistor to diffract the UV, thereby leaving a second photo-resist pattern 220B thinner than the first photo-resist pattern 220A.

Subsequently, the source/drain metal layer 105 is patterned by an etching process using the photo-resist pattern 220 having a step coverage to thereby provide the source/drain pattern and the semiconductor pattern 148 under it as shown in FIG. 9C. In this case, the source electrode 110 and the drain electrode 112 of this source/drain pattern have an integral structure.

Figure 9D:
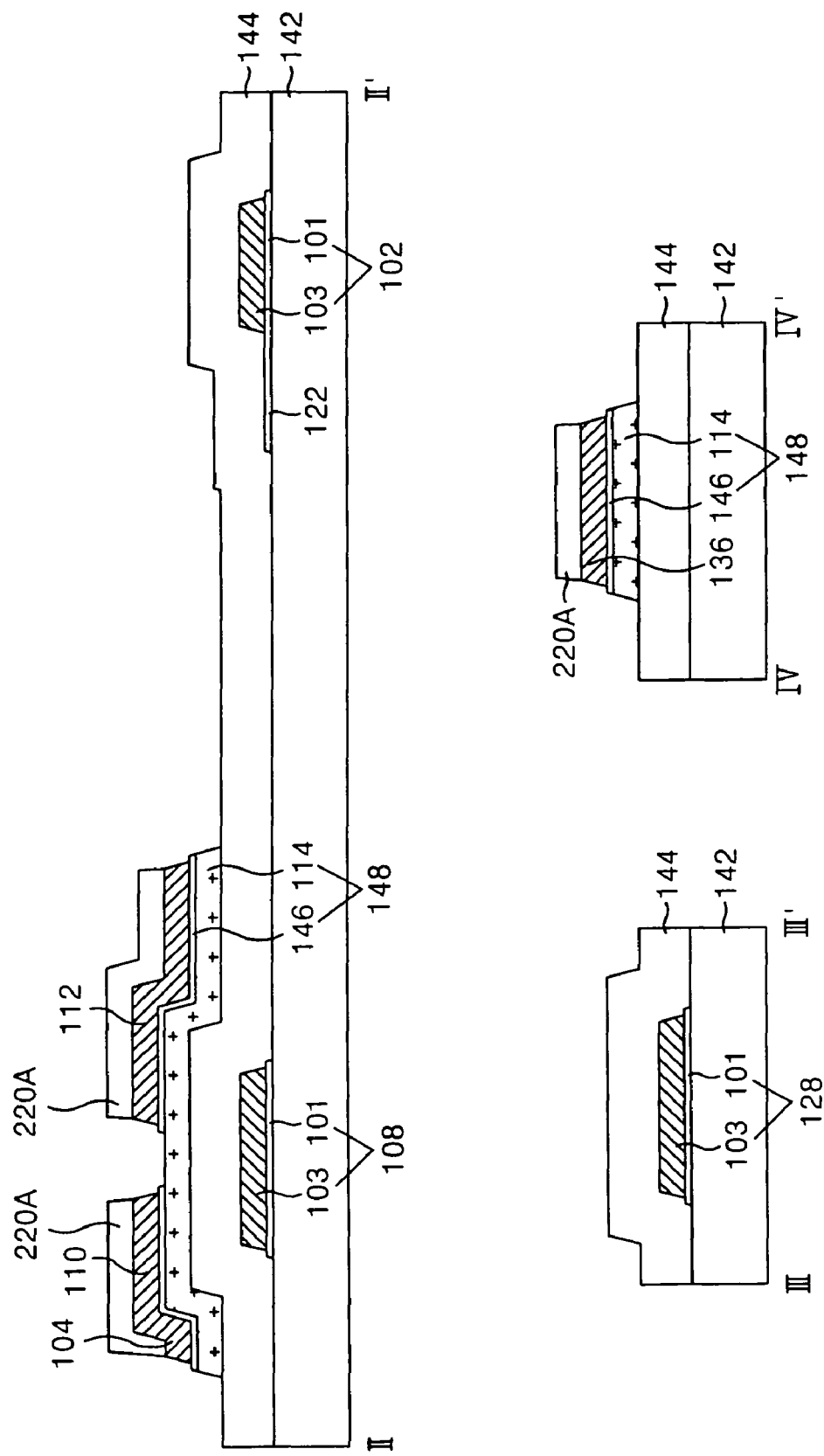

Then, the photo-resist pattern 220 is ashed by the ashing process using an oxygen (O$_2$) plasma to thereby thin the thickness of the first photo-resist pattern 220A and remove the second photo-resist pattern 220B as shown in FIG. 9D. Further, the source/drain pattern exposed by a removal of the second photo-resist pattern 220B and the ohmic contact layer under it is removed by an etching process using the ashed first photo-resist pattern 220A, thereby disconnecting the source electrode 110 from the drain electrode 112 and exposing the active layer 114. Thus, a channel consisting of the active layer 114 is provided between the source electrode 110 and the drain electrode 112. At this time, each side of the source/drain pattern is once more etched along the ashed first photo-resist pattern 220A to provide the source/drain pattern and semiconductor pattern 148 having a step coverage in a stepwise shape.

Consequently, the photo-resist pattern 220A left on the source/drain pattern is removed by a stripping process as shown in FIG. 9E.

Figure 10A:
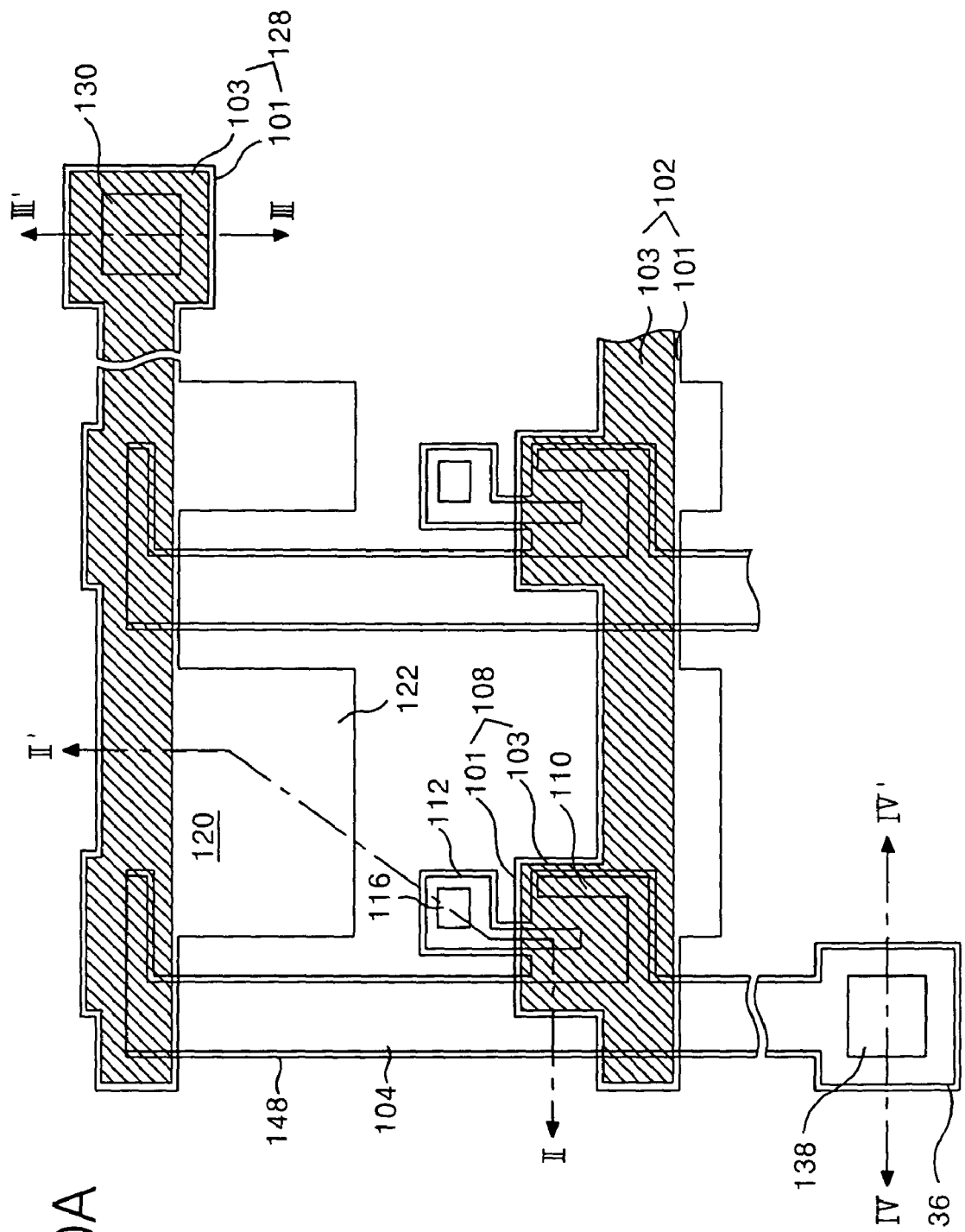
Figure 10B:
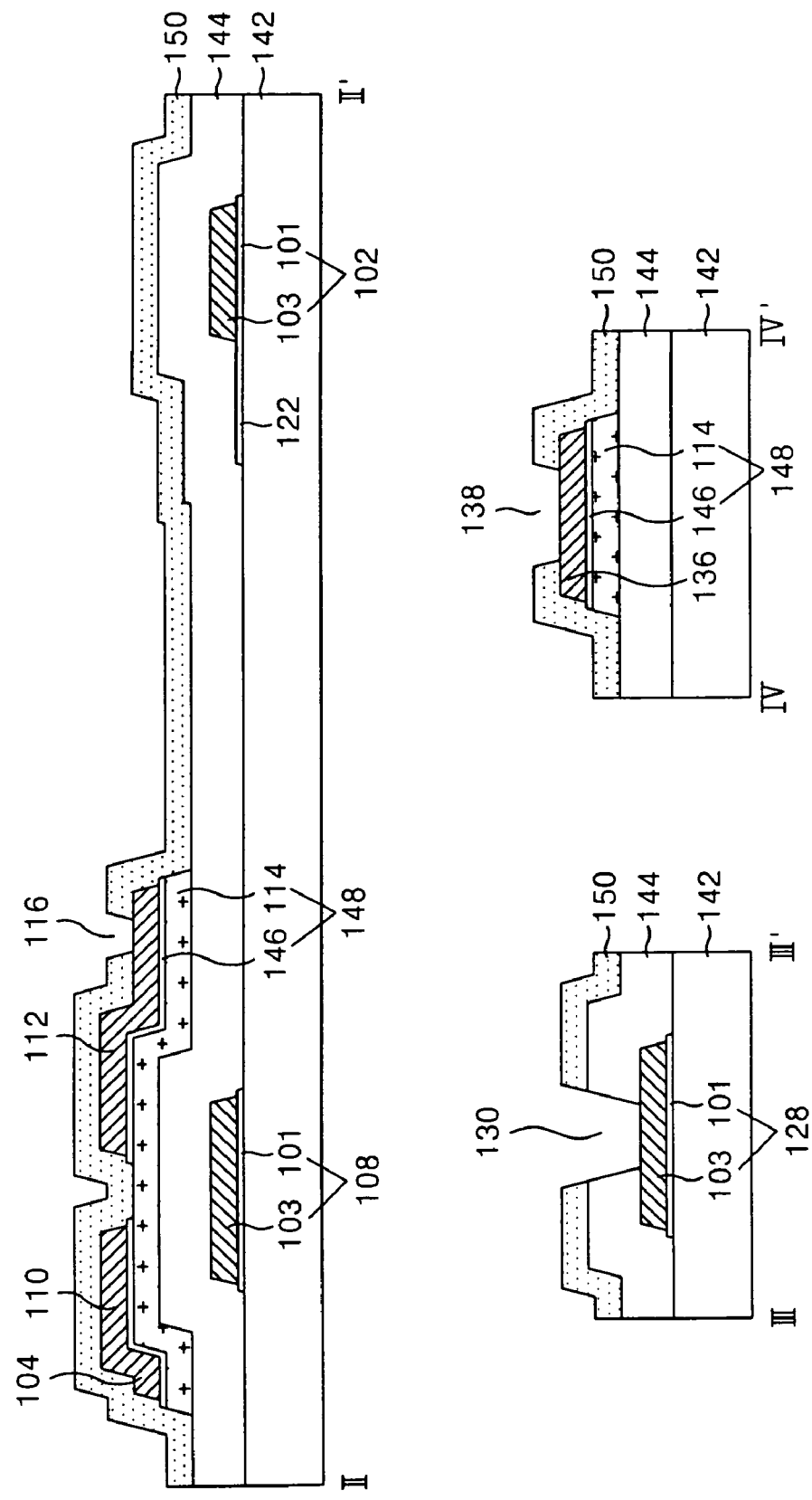

FIG. 10A to FIG. 10C are a plan view and section views for explaining a third mask process in a method of fabricating the thin film transistor substrate according to the embodiment of the present invention.

The passivation film 150 having a plurality of contact holes 116, 130 and 138 is formed by the gate insulating film 144 provided with the source/drain pattern by the third mask process.

The passivation film 150 is formed on the gate insulating film 144 provided with the source/drain pattern by a technique such as the PECVD and spin coating, etc. The passivation film 150 is formed of an inorganic insulating material identical to the gate insulating film 144, or an organic insulating material such as an acrylic organic compound having a small dielectric constant, BCB (benzocyclobutene) or PFCB (perfluorocyclobutane), etc. Then, the passivation film 150 is patterned by the photolithography process and the etching process to thereby provide the first contact hole exposing the drain electrode 112, the second contact hole 130 exposing the lower gate pad electrode 128 and the third contact hole 138 exposing the lower data pad electrode 136.

Meanwhile, when the source/drain metal is selected from Mo, the first and third contact holes 116 and 138 are formed in such a manner to pass through the active layer 114 as shown in FIG. 10C.

Figure 11A:
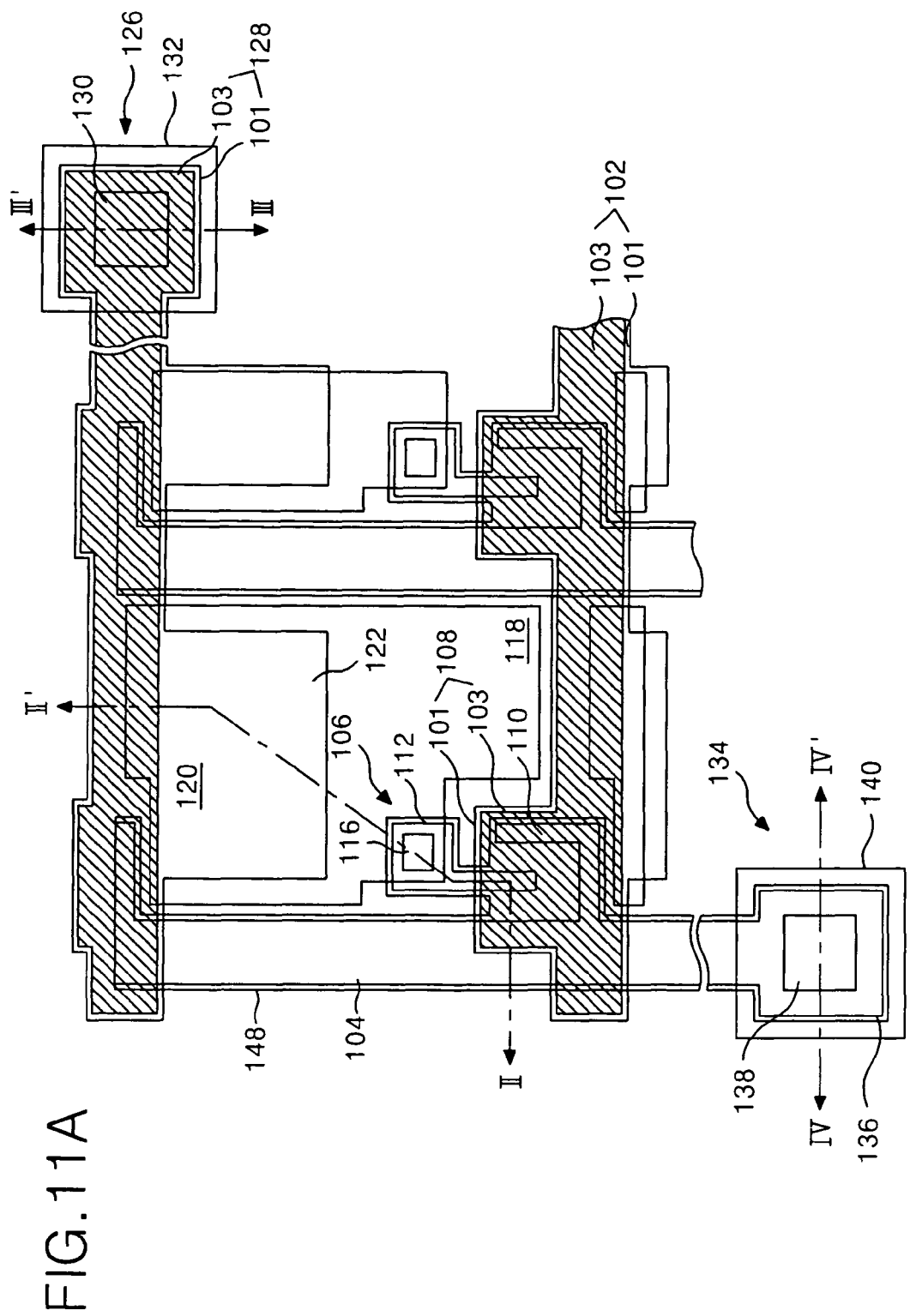

FIG. 11A and FIG. 11B are a plan view and a section view explaining a fourth mask process in a method of fabricating the thin film transistor substrate according to the embodiment of the present invention A transparent conductive pattern including the pixel electrode 118, the upper gate pad electrode 132 and the upper data pad electrode 140 is formed on the passivation film 150 by the fourth mask process.

The transparent conductive pattern is formed by preparing a transparent conductive layer using a deposition technique such as the sputtering, etc. and patterning it by the photolithography and the etching process. The transparent conductive layer is formed of ITO, TO or IZO, etc. similar to the first conductive layer 101 of the above-mentioned gate pattern. The pixel electrode 118 is connected, via the first contact hole 116, to the drain electrode 112; the upper gate pad electrode 132 is connected, via the second contact hole 130, to the lower gate pad electrode 128; and the upper data pad electrode 140 is connected, via the third contact hole 138, to the lower data pad electrode 136.

As described above, the method of fabricating the thin film transistor substrate according to the embodiment of the present invention forms the gate pattern having a double-layer structure and the lower storage electrode 122 having a single-layer structure using the half-tone mask, thereby simplifying a process by the four-mask process. Furthermore, the method of fabricating the thin film transistor substrate according to the embodiment of the present invention uses the half tone mask when it is intended to thinly form the photo-resist pattern corresponding to a relatively wide area like the lower storage electrode 122 while using the diffractive exposure mask when it is intended to thinly form the photo-resist pattern corresponding to a relatively narrow area like the channel of the thin film transistor 106, thereby improving a process efficiency.

Figure 12:
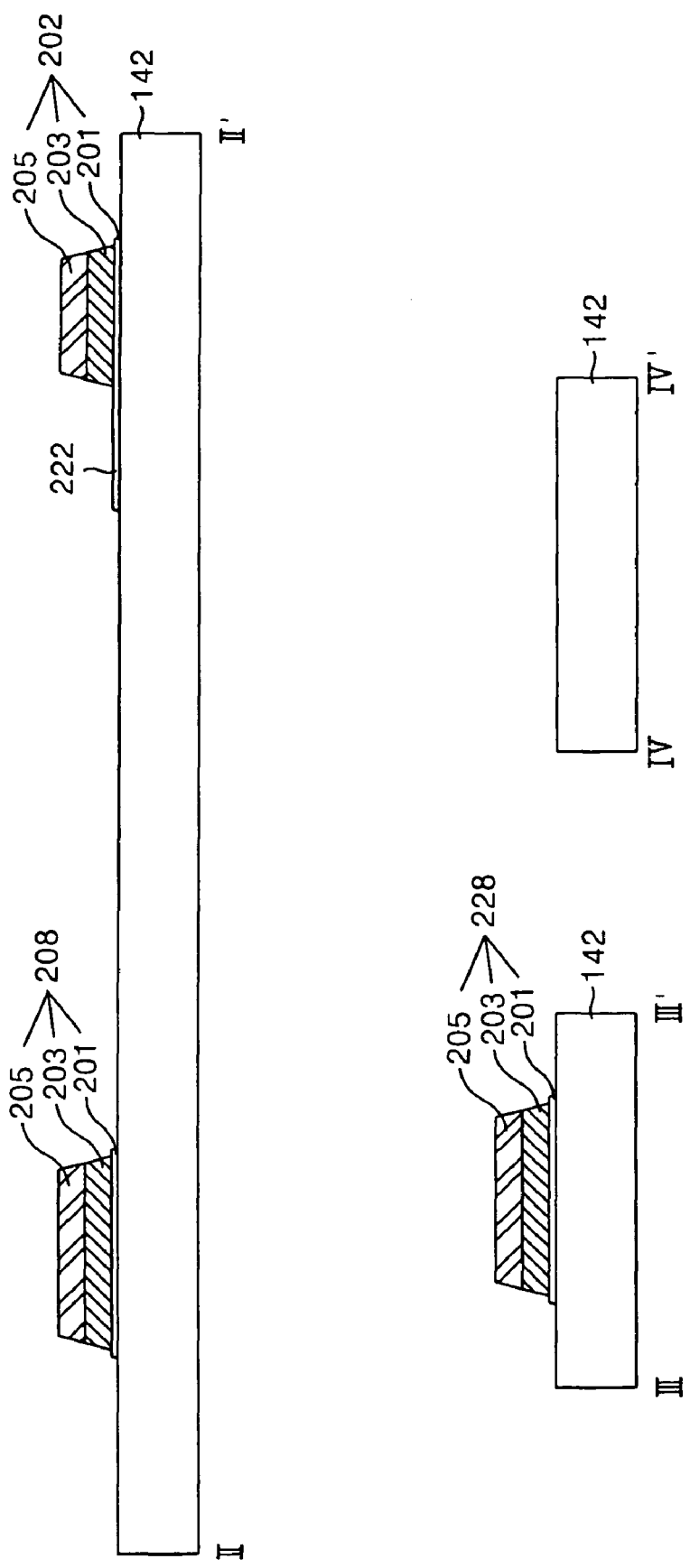
FIG. 12 is a section view showing a gate pattern in a thin film transistor substrate according to a second embodiment of the present invention.

FIG. 12 is a section view showing only a gate pattern formed by a first mask process in a thin film transistor substrate according to a second embodiment of the present invention.

The gate pattern shown in FIG. 12 includes a gate line 202, a gate electrode 208 and a lower gate pad electrode 228 having a triple-layer structure in which the first to third conductive layers 201, 203 and 205 are disposed, and a lower storage electrode 222 provided such that the first conductive layer 201 of the gate line 202 is extended into a pixel area. The gate pattern having the above-mentioned triple-layer and single-layer structure is formed by a single mask process using a half tone mask. The gate pattern having the triple-layer structure has a reduced line resistance such that it is may be used for a large-dimension or high-definition panel. The first conductive layer 201 is formed of a transparent conductive material such as indium-tin-oxide (ITO), tin-oxide (TO), indium-zinc-oxide (IZO) or the like. The second conductive layer 203 is formed of a metal material such as Mo, Ti, Cu or Al(Nd) group, etc. The third conductive layer 205 is formed from a metal material such as Cu, Al, Ti, Mo or Al(Nd) group, etc., and the second and third conductive layers 203 and 205 may be formed of a combination of these groups. For instance, they may be formed of Mo/ITO, Al(Nd)/ITO, Cu/ITO, Cu/Ti/ITO, Cu/Mo/ITO, Cu/Mo/ITO, Cu/Mo+Ti/ITO or Al(Nd)/Mo/ITO, etc. Herein, a more than double layer of Mo/ITO means that ITO should be formed first and Mo should be formed later.

Figure 13:
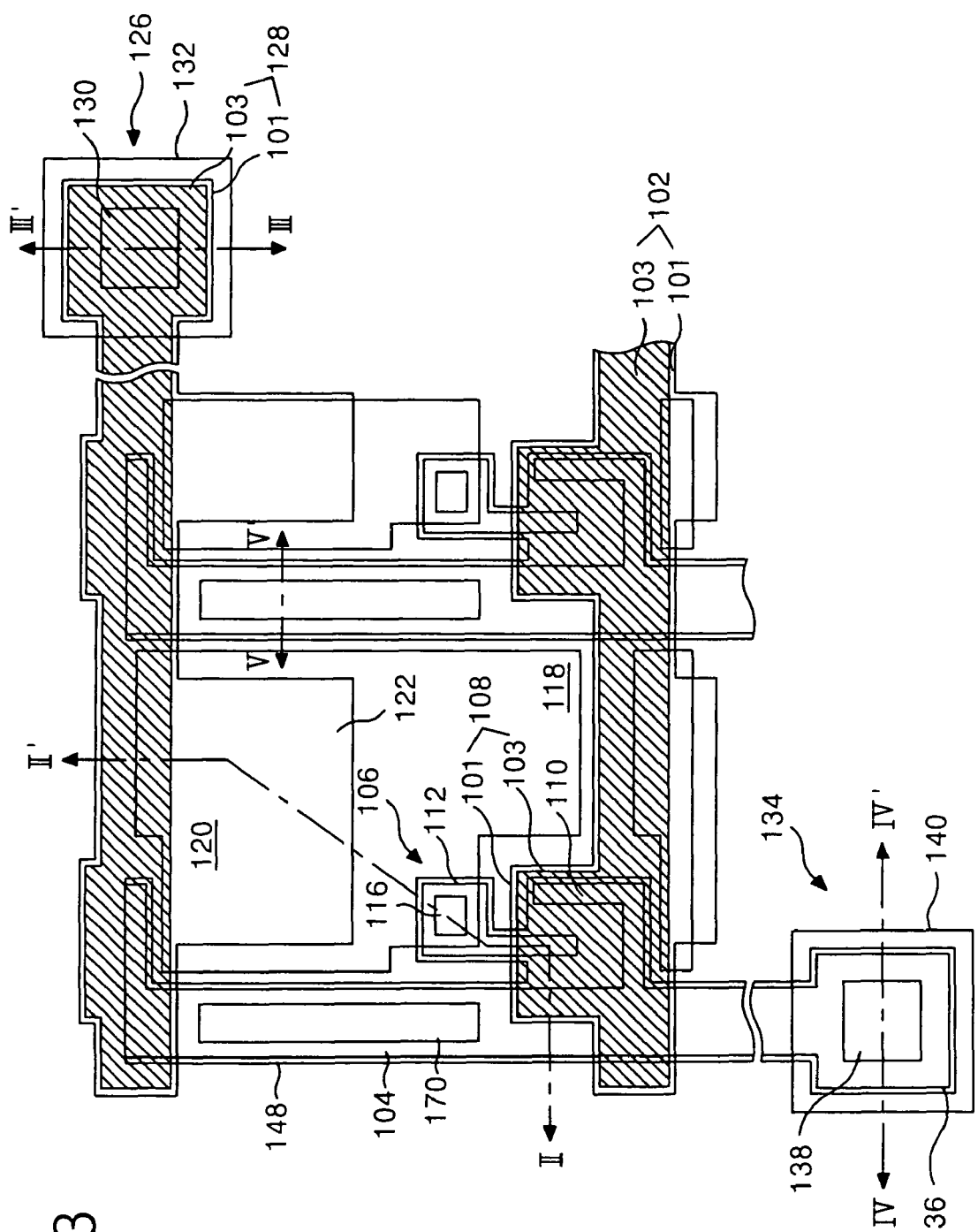
FIG. 13 is a plan view showing a portion of a thin film transistor substrate according to a third embodiment of the present invention.
Figure 14:
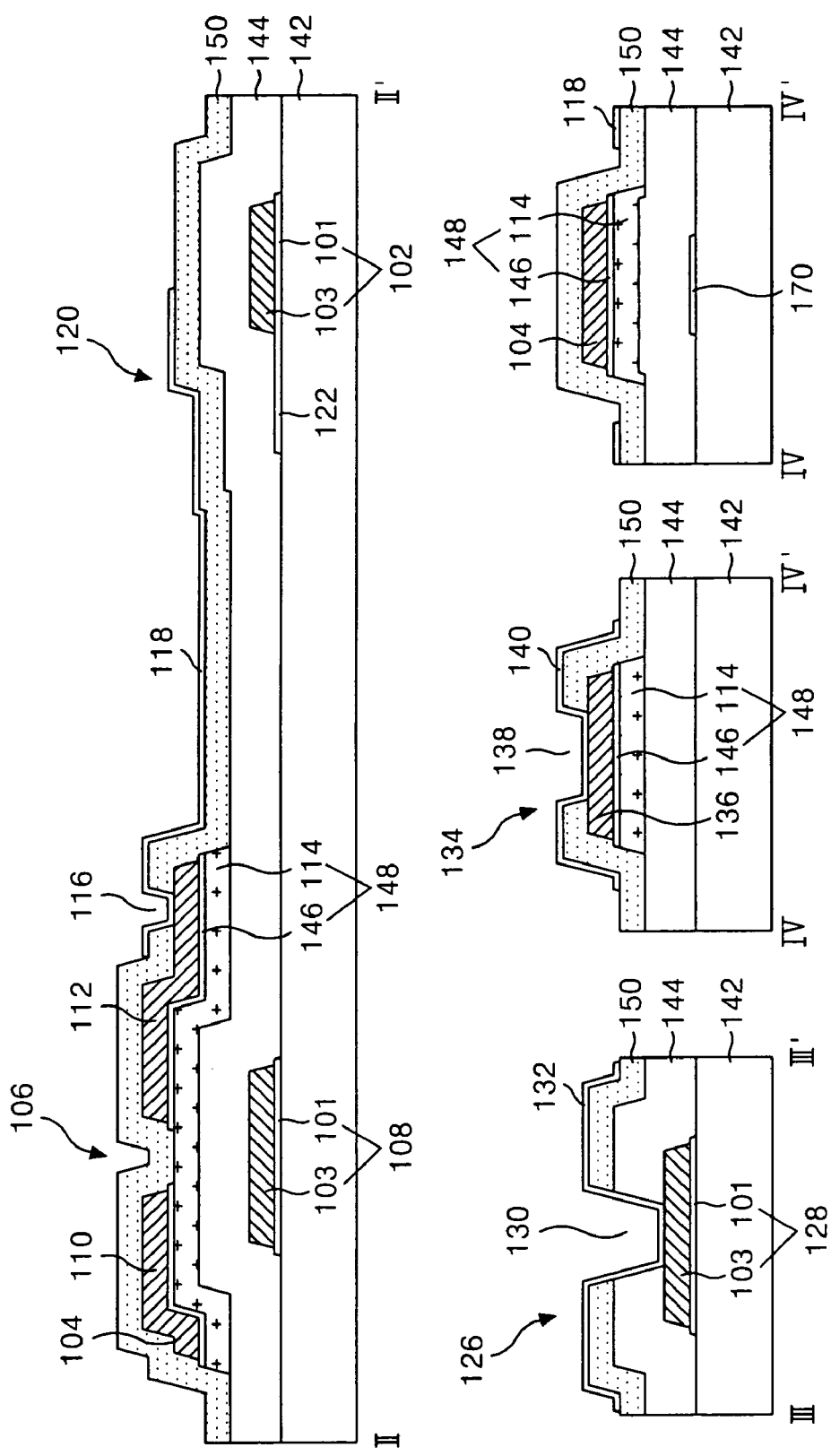
FIG. 14 is a section view of the thin film transistor substrate taken along the II-II', III-III', IV-IV' and V-V' lines in FIG. 13.

FIG. 13 is a plan view showing a portion of a thin film transistor substrate according to a third embodiment of the present invention, and FIG. 14 is a section view of the thin film transistor substrate taken along the II-II', III-III', IV-IV' and V-V' lines in FIG. 13.

The thin film transistor substrate shown in FIG. 13 and FIG. 14 has the same elements as the thin film transistor substrate shown in FIG. 4 and FIG. 5 except that it further includes a redundancy line overlapping with the data line 104. Therefore, an explanation as to the same elements will be omitted.

The redundancy line 170 is connected to the data line 104 by a welding technique using a laser or the like upon a breakage or defection of the data line 104 to thereby repair the broken data line 104. The redundancy line 170 may be formed as a single-layer structure like the lower storage electrode 122 or a double-layer (or triple-layer) structure like the gate line 102, along with the gate pattern including the gate line 102, the gate electrode 108, the lower gate pad electrode 128 and the lower storage electrode 122, by the half tone mask process. Further, the redundancy line 170 is formed independently between the gate lines 102 and floated such that it is not shorted with respect to the gate line 102 provided at the same layer.

Figure 15:
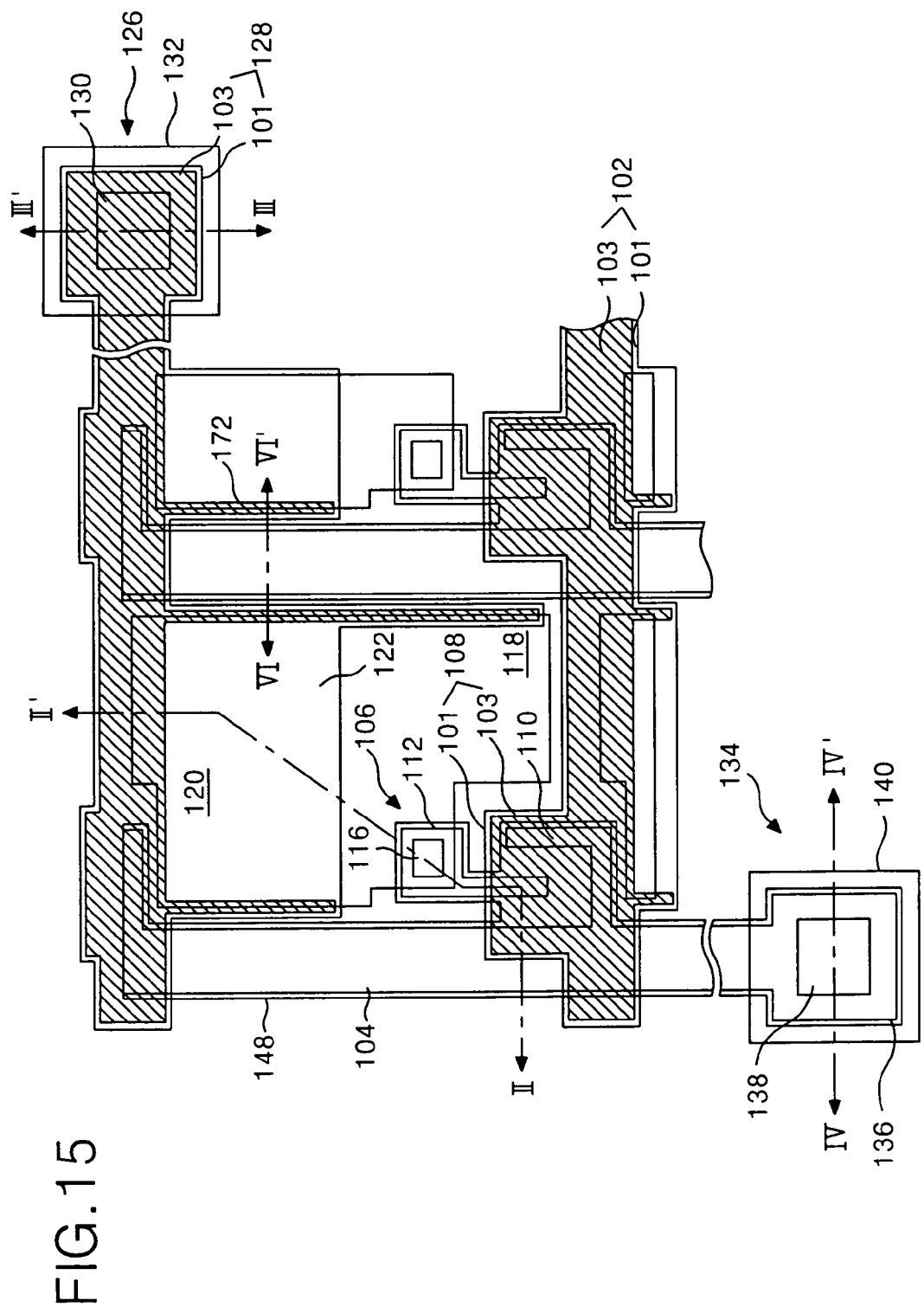
FIG. 15 is a plan view showing a portion of a thin film transistor substrate according to a fourth embodiment of the present invention.
Figure 16:
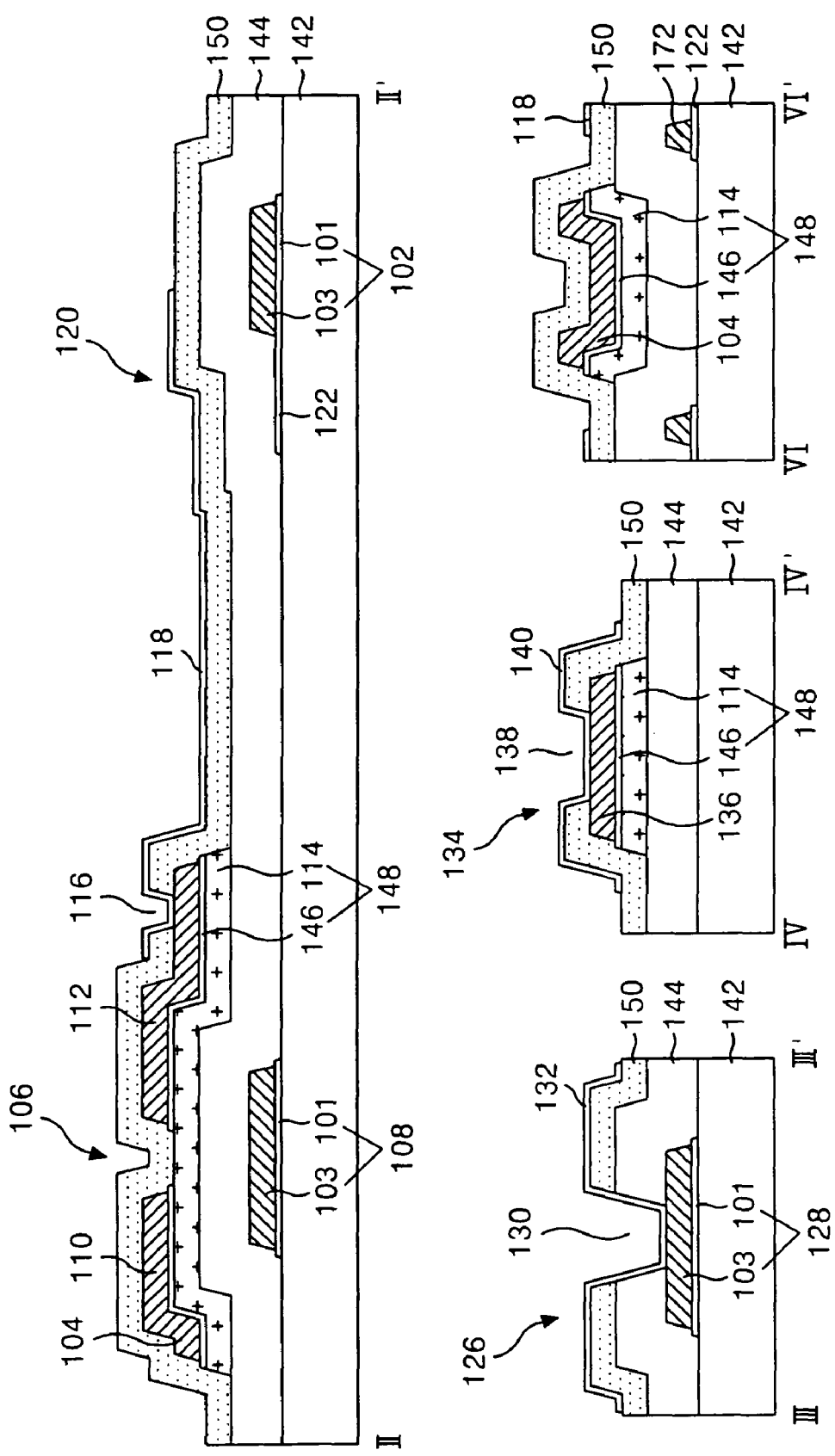
FIG. 16 is a section view of the thin film transistor substrate taken along the III-III', IV-IV' and VI-VI' lines in FIG. 15.

FIG. 15 is a plan view showing a portion of a thin film transistor substrate according to a fourth embodiment of the present invention, and FIG. 16 is a section view of the thin film transistor substrate taken along the III-III', IV-IV' and VI-VI' lines in FIG. 15.

The thin film transistor substrate shown in FIG. 15 and FIG. 16 has the same elements as the thin film transistor substrate shown in FIG. 4 and FIG. 5 except that it further includes a light-shielding pattern 172 overlapping with each side of the pixel electrode 118. Therefore, an explanation as to the same elements will be omitted.

The light-shielding pattern 172 is formed such that the second conductive layer 103 is extended from the gate line 102 to thereby overlap with each side of the pixel electrode 118, whereas the lower storage electrode 122 is formed in such a manner as to overlap with the light-shielding pattern 172 for the sake of a process. The light-shielding pattern 172 prevents a light leakage between the data line 104 and the pixel electrode 118 when it is intended to enlarge a distance between the data line 104 and the pixel electrode 118 for the purpose of reducing a parasitic capacitor. The light-shielding pattern 172 is formed from the second conductive layer 102, along with the gate pattern including the gate line 102, the gate electrode 108, the lower gate pad electrode 128 and the lower storage electrode 122, by the half tone mask process. The lower portion of the light-shielding pattern 172 overlaps with the lower storage electrode 122 that is the first conductive layer 101.

Figure 17:
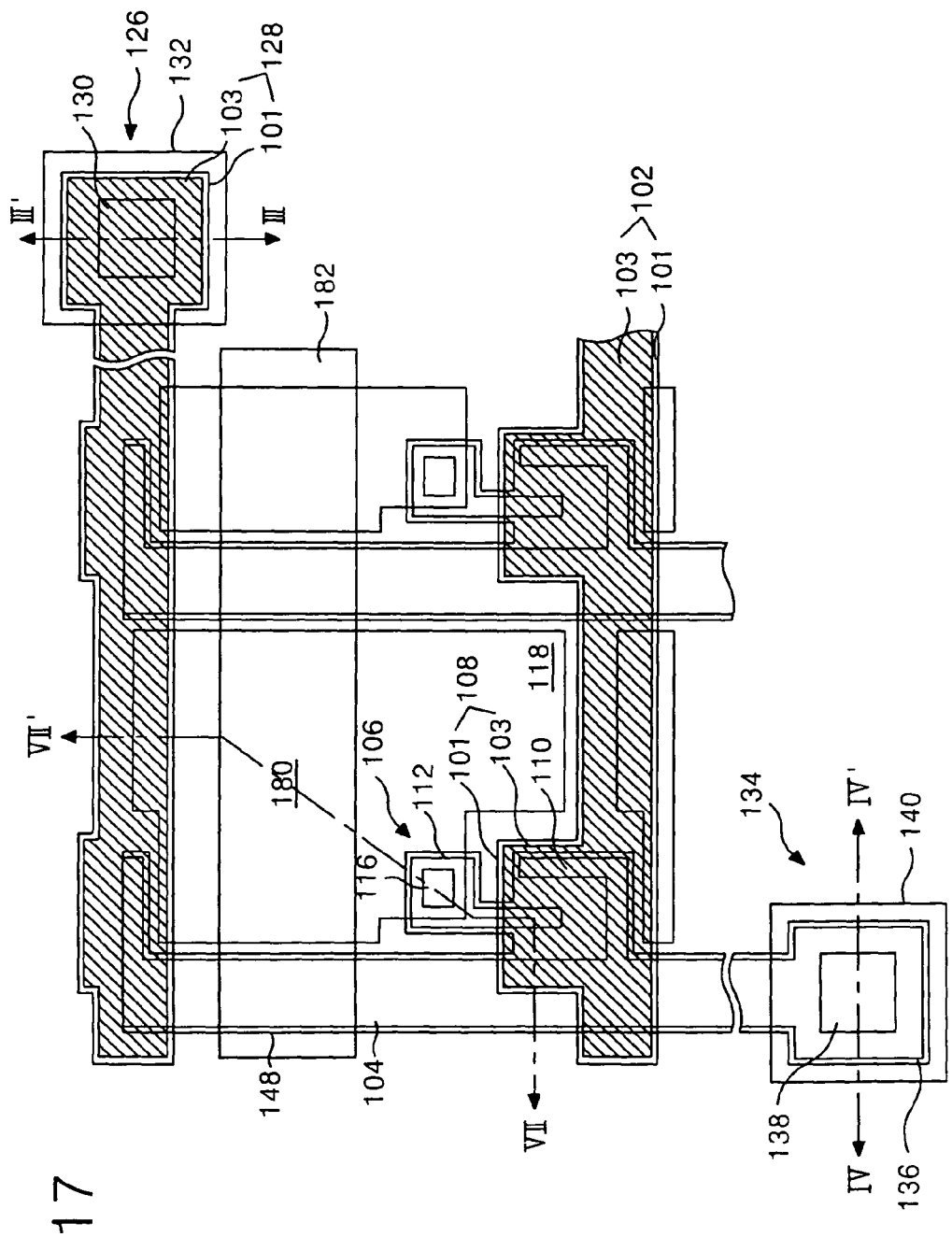
FIG. 17 is a plan view showing a portion of a thin film transistor substrate according to a fifth embodiment of the present invention.
Figure 18:
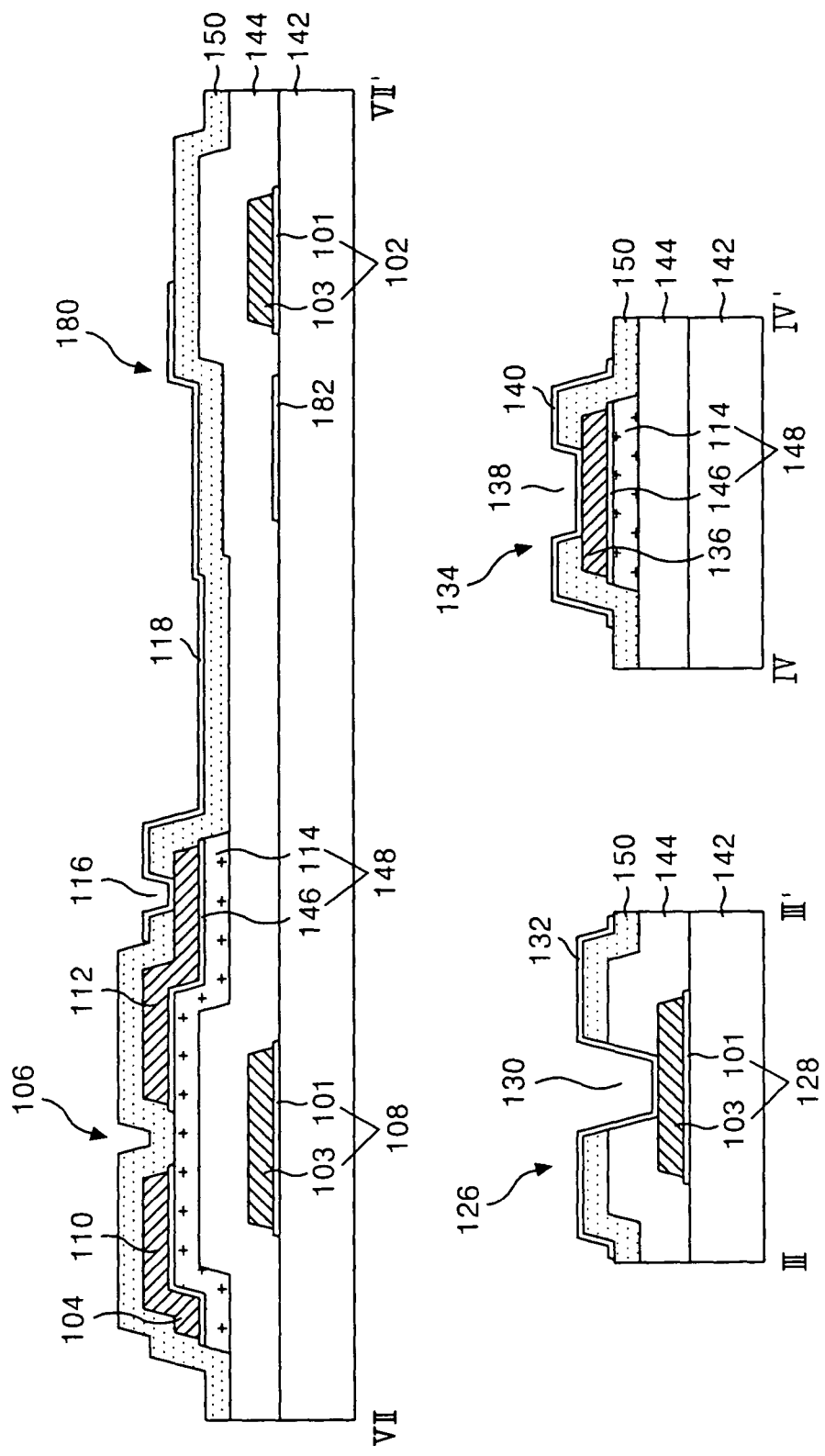
FIG. 18 is a section view of the thin film transistor substrate taken along the III-III', IV-IV' and VII-VII' lines in FIG. 17.

FIG. 17 is a plan view showing a portion of a thin film transistor substrate according to a fifth embodiment of the present invention, and FIG. 18 is a section view of the thin film transistor substrate taken along the III-III', IV-IV' and VII-VII' lines in FIG. 17.

The thin film transistor substrate shown in FIG. 17 and FIG. 18 has the same elements as the thin film transistor substrate shown in FIG. 4 and FIG. 5 except that a storage capacitor 180 is formed by an overlap between the common line 182 and the pixel electrode 118. Therefore, an explanation as to the same elements will be omitted.

The storage capacitor 180 is formed such that the common line 182 is overlapped by the pixel electrode 118 having the gate insulating film 144 and the passivation film 150 therebetween. The common line 182 crosses the pixel electrode 118 and the data line 104 substantially parallel to the gate line 102. The common line 182 is formed, along with the gate pattern including the gate line 102, the gate electrode 198 and the lower gate pad electrode 128, by the half tone mask process. At this time, the common line 182 is formed from only the first conductive layer 101 that is a transparent conductive layer unlike a double-layer (or triple-layer) structure of gate pattern by utilizing a partial transmitting part of the half tone mask. Accordingly, both the pixel electrode 118 and the common line 182 that are the upper and lower electrodes of the storage capacitor 180, respectively, are formed from a transparent conductive layer, so that it becomes possible to enlarge an overlap area between two electrodes 118 and 182 without any reduction of aperture ratio and hence to increase a capacitance value of the storage capacitor 180.

Figure 19:
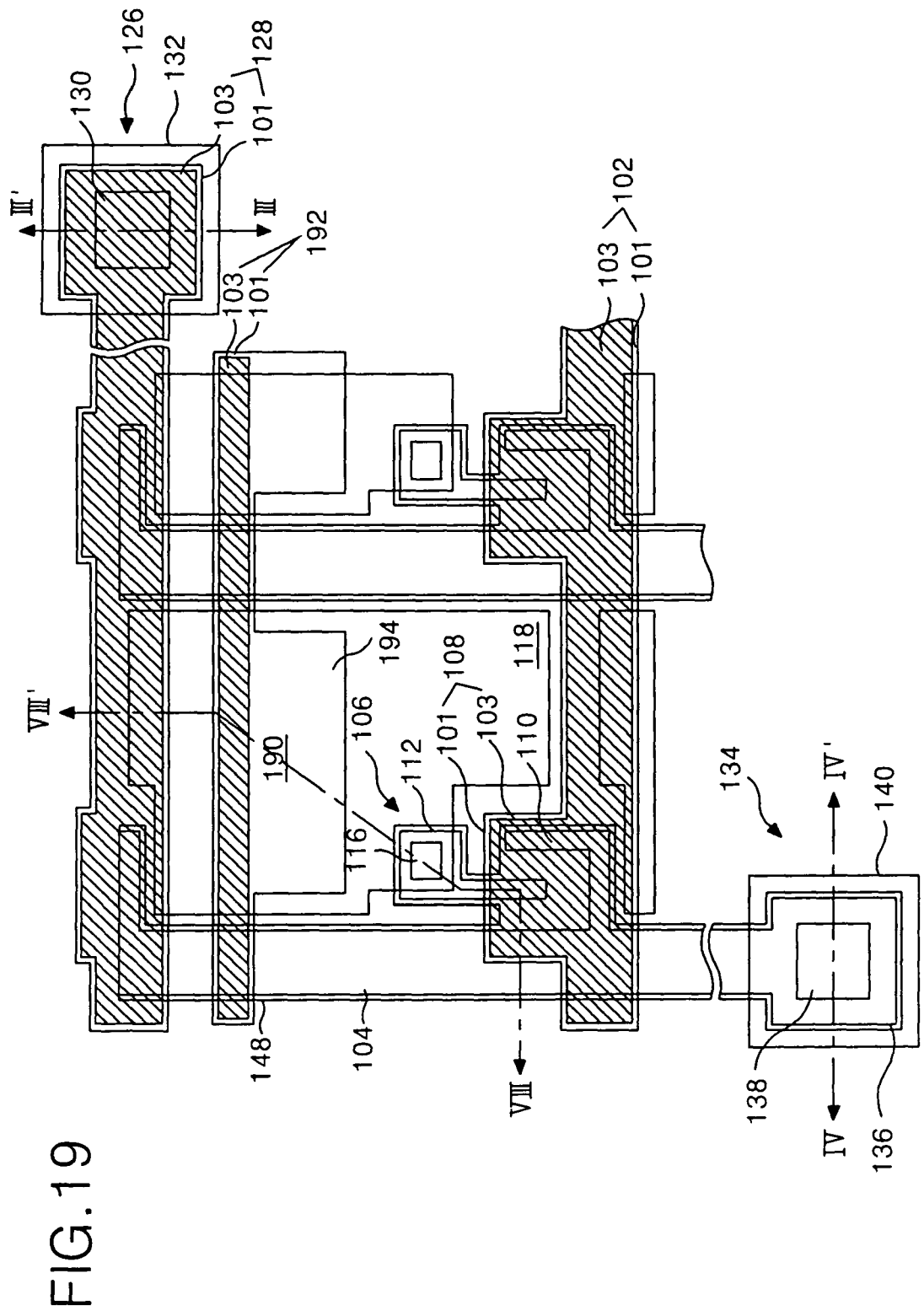
FIG. 19 is a plan view showing a portion of a thin film transistor substrate according to a sixth embodiment of the present invention.

FIG. 19 is a plan view showing a portion of a thin film transistor substrate according to a sixth embodiment of the present invention, and FIG. 20 is a section view of the thin film transistor substrate taken along the III-III', IV-IV' and VIII-VIII' lines in FIG. 19.

The thin film transistor substrate shown in FIG. 19 and FIG. 20 has the same elements as the thin film transistor substrate shown in FIG. 4 and FIG. 5 except that a storage capacitor 190 is formed by an overlap among the common line 182, the lower storage electrode 194 connected thereto and the pixel electrode 118. Therefore, an explanation as to the same elements will be omitted.

The storage capacitor 190 is formed such that the common line 192 and the lower storage electrode 194 are overlapped by the pixel electrode 118 with the gate insulating film 144 and the passivation film 150 therebetween. The common line 192 is formed by a double-layer (or triple-layer) structure crossing the pixel electrode 118 and the data line 104 substantially parallel to the gate line 102. The lower storage electrode 194 is formed by a protrusion of the first conductive layer 101, that is, the transparent conductive layer, of the common line 192 at each pixel area. The common line 182 and the lower storage electrode 194 are formed, along with the gate pattern including the gate line 102, the gate electrode 198 and the lower gate pad electrode 128, by the half tone mask process. At this time, the lower storage electrode 194 is formed from only the first conductive layer 101 that is a transparent conductive layer unlike a double-layer (or triple-layer) structure of gate pattern and the common line 192 by utilizing a partial transmitting part of the half tone mask. Accordingly, an overlap area between the lower storage electrode 194 and the pixel electrode 118 can be enlarged without any reduction of aperture ratio to increase a capacitance value of the storage capacitor 190. Furthermore, the common line 192 takes a double-layer (or triple-layer) structure like the gate pattern to reduce a line resistance, so that a line width of the common line 192 can be reduced to minimize a parasitic capacitor caused by an intersection between the common line 192 and the data line 104.

As described above, according to the present invention, both the upper and lower electrodes of the storage capacitor are formed from a transparent conductive layer, so that it becomes possible to enlarge an overlap area between two electrodes without any reduction of aperture ratio and hence to increase a capacitance value of the storage capacitor.

Particularly, according to the present invention, a single-layer structure of a lower storage electrode (or common line) is formed, along with a double-layer (or triple-layer) structure of gate pattern, by utilizing the half tone mask, thereby simplifying a process. Furthermore, according to the present invention, the first and second conductive layers of the gate pattern taking a double-layer (or triple-layer) structure has a constant step coverage in a stepwise shape by the half-tone mask process, so that it becomes possible to prevent a breakage of the source/drain pattern caused by an inclination of the first and second conductive layers.

Moreover, according to the present invention, the halftone mask is used when it is intended to relatively thinly define the wide photo-resist pattern, whereas the diffractive exposure mask is used when it is intended to relatively thinly define the narrow photo-resist pattern. Thus, it becomes possible to improve the process efficiency.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Thus, it is intended that the present invention cover the modifications and variations of this invention provided they come within the scope of the appended claims and their equivalents.

What is claimed is:

1. A liquid crystal display device, comprising:
a double-layered gate line having a first transparent conductive layer and a second opaque conductive layer;
a gate insulation film on the gate line;
a data line crossing the gate line to define a pixel region;
a thin film transistor connected to the gate line and the data line;
a pixel electrode connected to the thin film transistor via a contact hole of a protective film on the thin film transistor; and
a storage capacitor overlapping the pixel electrode and having a lower storage electrode extended from the first transparent conductive layer of the double-layered gate line, the pixel electrode overlapped with the lower storage electrode being an upper storage electrode.

2. The device of claim 1, wherein the lower storage electrode protrudes from the first transparent conductive layer of the gate line toward the pixel region.

3. The device of claim 1, further comprising a common line crossing the pixel electrode and the data line.

4. The device of claim 3, wherein the common line is formed of the first transparent conductive layer of the lower storage electrode.

5. The device of claim 3, wherein the common line is formed similar to the double-layer of the gate line.

6. The device of claim 5, wherein the lower storage electrode protrudes from a first conductive layer of the gate line toward the pixel region.

7. The device of claim 1, further comprising a redundancy line independently formed between the gate lines.

8. The device of claim 7, wherein the redundancy line overlaps the data line.

9. The device of claim 7, wherein the redundancy line is formed of one of the first transparent conductive layer and a double-layer of the gate line.

10. The device of claim 1, further comprising a light-shielding pattern protruded from the second conductive layer of the gate line and overlapping with both sides of the pixel electrode.

11. The device of claim 10, wherein the light-shielding pattern overlaps the lower storage electrode.

12. The device of claim 1, further comprising a gate pad including a lower gate pad electrode having a double-layer and an upper gate pad electrode connected to the lower gate pad electrode via a contact hole of the gate insulating film and the protective film, wherein the lower gate pad electrode is connected to the gate line.

13. The device of claim 1, further comprising a data pad including a lower data pad electrode connected to the data line, and an upper data pad electrode connected to the lower data pad electrode via a contact hole of the protective film.

14. The device of claim 1, wherein the gate line further includes a third conductive layer on the second conductive layer.

15. The device of claim 1, wherein a gate electrode of the thin film transistor is connected to the gate line, the gate electrode having a double-layer.

* * * * *